United States Patent
Ota et al.

(10) Patent No.: US 9,768,257 B2
(45) Date of Patent: Sep. 19, 2017

(54) SEMICONDUCTOR DEVICE

(71) Applicant: Renesas Electronics Corporation, Kawasaki-shi, Kanagawa (JP)

(72) Inventors: Kazuki Ota, Kanagawa (JP); Yuji Ando, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 14/153,203

(22) Filed: Jan. 13, 2014

(65) Prior Publication Data
US 2014/0209922 A1  Jul. 31, 2014

(30) Foreign Application Priority Data
Jan. 30, 2013  (JP) .................. 2013-015448

(51) Int. Cl.
| H01L 29/10  | (2006.01) |
| H01L 29/423 | (2006.01) |
| H01L 29/778 | (2006.01) |
| H01L 29/40  | (2006.01) |
| H01L 29/20  | (2006.01) |

(52) U.S. Cl.
CPC ........ *H01L 29/1029* (2013.01); *H01L 29/402* (2013.01); *H01L 29/42316* (2013.01); *H01L 29/7787* (2013.01); H01L 29/1066 (2013.01); H01L 29/2003 (2013.01)

(58) Field of Classification Search
None
See application file for complete search history.

(56) References Cited

U.S. PATENT DOCUMENTS

| 7,825,434 B2 | 11/2010 | Ueno et al. |
| 7,868,355 B2 * | 1/2011 | Sato ................ H01L 29/1066 257/192 |
| 8,304,811 B2 * | 11/2012 | Zhang ............... H01L 29/42316 257/194 |

(Continued)

FOREIGN PATENT DOCUMENTS

| JP | 11-261053 A   | 9/1999 |
| JP | 2007-201093 A | 8/2007 |

(Continued)

OTHER PUBLICATIONS

Dry Etching Tutorial, IPCI Project, pp. 1-2, printed Jun. 29, 2016.*

(Continued)

*Primary Examiner* — Tom Thomas
*Assistant Examiner* — Steven B Gauthier
(74) *Attorney, Agent, or Firm* — Sughrue Mion, PLLC

(57) ABSTRACT

A high electron mobility transistor having a channel layer, electron supply layer, source electrode, and drain electrode is included so as to have a cap layer formed on the electron supply layer between the source and drain electrodes and having an inclined side surface, an insulating film having an opening portion on the upper surface of the cap layer and covering the side surface thereof, and a gate electrode is formed in the opening portion and extending, via the insulating film, over the side surface of the cap layer on the drain electrode side. The gate electrode having an overhang on the drain electrode side can reduce the peak electric field.

18 Claims, 16 Drawing Sheets

(56) References Cited

U.S. PATENT DOCUMENTS

| | | |
|---|---|---|
| 8,404,508 B2 | 3/2013 | Lidow et al. |
| 8,603,880 B2 | 12/2013 | Yamada |
| 2005/0110042 A1 | 5/2005 | Saito et al. |
| 2006/0273347 A1 | 12/2006 | Hikita et al. |
| 2008/0087915 A1* | 4/2008 | Uemoto .............. H01L 29/1066 257/192 |
| 2009/0267114 A1* | 10/2009 | Nakayama .......... H01L 29/2003 257/192 |
| 2011/0095337 A1* | 4/2011 | Sato .................... H01L 29/0891 257/194 |
| 2012/0193688 A1 | 8/2012 | Lidow et al. |
| 2013/0113018 A1 | 5/2013 | Wakita et al. |

FOREIGN PATENT DOCUMENTS

| | | |
|---|---|---|
| JP | 2011-204877 A | 10/2011 |
| JP | 2012-033679 A | 2/2012 |
| JP | 2012-174714 A | 9/2012 |
| JP | 2012-523697 A | 10/2012 |

OTHER PUBLICATIONS

Communication dated Sep. 9, 2015 from the European Patent Office in counterpart application No. 14150329.2.
Communication dated Aug. 9, 2016, from the Japanese Patent Office in counterpart Japanese application No. 2013-015448.
Communication dated Jan. 17, 2017 from the Japanese Patent Office in counterpart Application No. 2013-015448.

* cited by examiner

SEMICONDUCTOR DEVICE

CROSS-REFERENCE TO RELATED APPLICATIONS

The disclosure of Japanese Patent Application No. 2013-015448 filed on Jan. 30, 2013 including the specification, drawings and abstract is incorporated herein by reference in its entirety.

BACKGROUND

The present invention relates to a semiconductor device, for example, a technology preferably used for a semiconductor device using a nitride semiconductor.

GaN-based nitride semiconductors have a wide band gap and a high electron mobility compared with Si- or GaAs-based ones so that application of them to high breakdown voltage, high output power, or high frequency transistors is expected. They have therefore been developed actively in recent years.

For example, Patent Document (Japanese Patent Laid-Open No. 261053/1999) discloses a technology relating to high electron mobility transistor (HEMT) using a GaN-based compound semiconductor.

Patent Document 2 (Japanese Patent Laid-Open No. 2012-33679) discloses a field effect transistor made of a Group III nitride semiconductor and this transistor has a field plate (109) extending over from a gate electrode (106) to the side of a drain electrode (107).

In the above description, the numbers in the parentheses are those described in the corresponding Patent Document.

[Patent Document 1] Japanese Patent Laid-Open No. 261053/1999

[Patent Document 2] Japanese Patent Laid-Open No. 2012-33679

SUMMARY

The present inventors are involved in research and development of semiconductor devices using a nitride semiconductor and have carried out an extensive investigation with a view to providing semiconductor devices having improved characteristics. They have found, during the research and development, that there is a room for further improvement in the characteristics of semiconductor devices using a nitride semiconductor such as current collapse, gate leakage, and breakdown voltage.

The other problems and novel features of the invention will be apparent by the description herein and accompanying drawings.

The outline of the typical embodiments, among embodiments disclosed herein, will next be described briefly.

A semiconductor device according to one embodiment disclosed herein is a semiconductor device having a channel layer, an electron supply layer, a source electrode, and a drain electrode. This semiconductor device further has a cap layer composed of a p type semiconductor layer, formed on the electron supply layer between the source electrode and the drain electrode, and having an inclined side surface. This semiconductor device further has an insulating film having an opening portion on the upper surface of the cap layer and covering the side surface of the cap layer and a gate electrode extending from the opening portion to above the side surface on the side of the drain electrode via the insulating film.

A semiconductor device according to another embodiment disclosed herein is a semiconductor device having a channel layer, an electron supply layer, a source electrode, and a drain electrode. This semiconductor device further has a cap layer composed of a p type semiconductor layer, formed on the electron supply layer between the source electrode and the drain electrode, and having an inclined side surface. This semiconductor device further has a first gate electrode portion formed on the upper surface of the cap layer. The semiconductor device further has an insulating film having an opening portion on the upper surface of the first gate electrode portion and covering the side surface of the cap layer and a second gate electrode portion extending from the opening portion to above the side surface on the side of the drain electrode via the insulating film.

A semiconductor device according to a further embodiment disclosed herein is a semiconductor device having a channel layer, an electron supply layer, a source electrode, and a drain electrode. This semiconductor device further has a cap layer composed of a p type semiconductor layer and formed on the electron supply layer between the source electrode and the drain electrode. This semiconductor device further has a first gate electrode portion formed on the upper surface of the cap layer. The semiconductor device further has a second gate electrode portion extending over, via an insulating film, from the cap layer on the side of the drain electrode while covering the side surface of the cap layer, and electrically coupled to the first gate electrode portion.

The semiconductor devices shown in the following typical embodiments disclosed herein can have improved characteristics.

DETAILED DESCRIPTION

Figure 1:
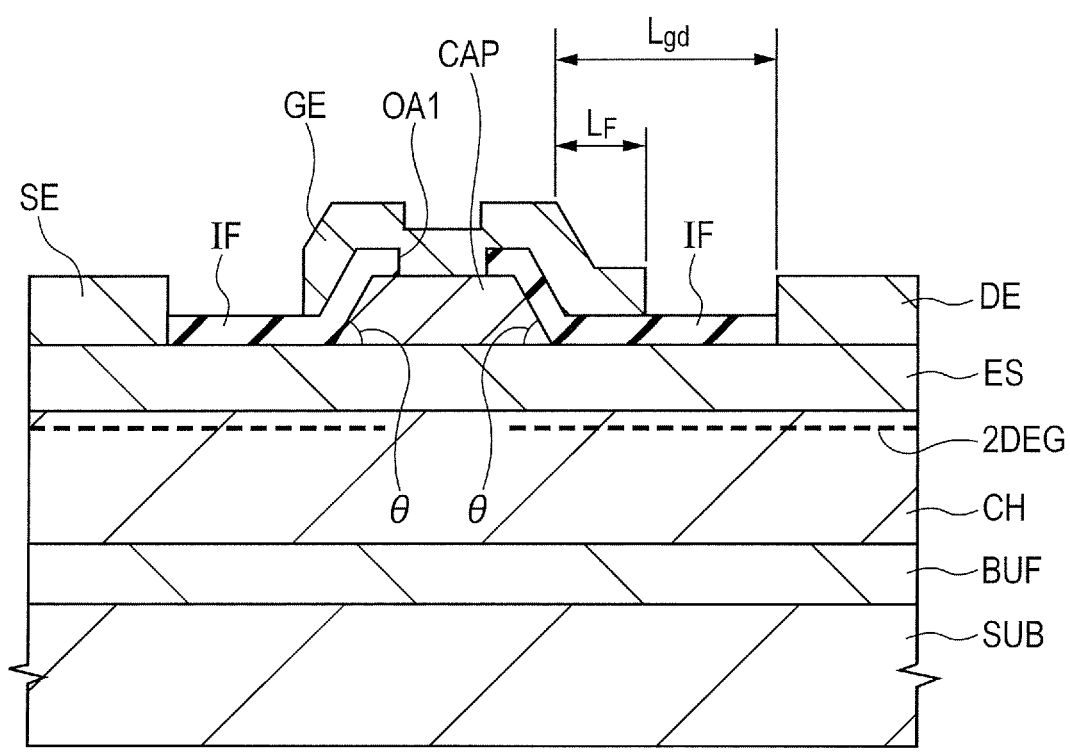
FIG. 1 is a cross-sectional view showing the constitution of a semiconductor device of First Embodiment.

In the below-described embodiments, a description will be made after divided into a plurality of sections or embodiments if necessary for convenience sake. They are not independent from each other, but in a relation such that one is a modification example, application example, detailed description, complementary description, or the like of a part or whole of the other one unless otherwise specifically indicated. In the below-described embodiments, when a reference is made to the number of components (including the number, value, amount, range, and the like), the number is not limited to a specific number but may be more than or less than the specific number, unless otherwise specifically indicated or principally apparent that the number is limited to the specific number.

Further, in the below-described embodiments, the constituents (including constituent steps and the like) are not always essential unless otherwise specifically indicated or principally apparent that they are essential. Similarly, in the below-described embodiments, when a reference is made to the shape, positional relationship, or the like of the constituents, that substantially approximate or similar to it is also embraced unless otherwise specifically indicated or principally apparent that it is not. This also applies to the above-mentioned number (including number, value, amount, range, or the like).

The embodiments will next be described in detail based on drawings. In all the drawings for describing the embodiments, members having the same function will be identified by the same or like symbols and overlapping descriptions will be omitted. When there are two or more members (sites) similar to each other, individual or particular sites may be discriminated from each other by adding a specific symbol to a generic symbol. In the below-described embodiments, a repeated description of the same or similar portions will be omitted in principle unless particularly necessary.

In the drawings to be used in the following embodiments, even a cross-sectional view is sometimes not hatched to facilitate viewing of them.

In the cross-sectional views, the size of each site sometimes does not correspond to that of the actual device and certain sites may be relatively enlarged to facilitate understanding of the drawings.

First Embodiment

A semiconductor device of this embodiment will next be described in detail referring to drawings.

[Description of Structure]

FIG. 1 is a cross-sectional view showing the constitution of a semiconductor device of the present embodiment. The semiconductor device shown in FIG. 1 is a field effect transistor (FET) using a nitride semiconductor. It is also called "high electron mobility transistor" (HEMT).

As shown in FIG. 1, the semiconductor device of the present embodiment has a buffer layer BUF on a substrate SUB, a channel layer CH made of a nitride semiconductor on the buffer layer BUF, and an electron supply layer ES made of a nitride semiconductor on the channel layer CH. This means that the substrate SUB has, on the main surface (upper surface) thereof, the buffer layer BUF, the channel layer CH, and the electron supply layer ES which have been formed (stacked) successively one after another in order of mention. The electron supply layer ES has thereon a source electrode SE and a drain electrode DE. The electron supply layer ES has thereon a gate electrode GE via a cap layer CAP. The cap layer CAP has thereon an insulating film IF having an opening portion OA1 and the upper surface of the cap layer CAP and the gate electrode GE are brought into contact with each other via the opening portion OA1.

In the present embodiment, the gate electrode GE has an overhang on the side of the drain electrode DE. For example, the distance from the center portion of the opening portion OA1 to the end portion of the gate electrode GE on the side of the drain electrode DE is greater than the distance from the center portion of the opening portion OA1 to the end portion of the gate electrode GE on the side of the source electrode SE.

By causing the gate electrode GE to overhang on the side of the drain electrode DE in such a manner, an electric field is dispersed to two positions, that is, the vicinity of the side surface of the cap layer CAP on the side of the drain electrode DE and the top of the overhang portion of the gate electrode GE. The electric field is therefore relaxed. For example, the peak electric field is made smaller than that in the case of FIG. 1 of Patent Document 1 (also refer to FIGS. 25 and 26 described later).

Supposing that the overhang distance from the end portion of the cap layer CAP on the side of the drain electrode DE to the end portion of the gate electrode GE on the side of the drain electrode DE is $L_F$ and the distance from the end portion of the cap layer CAP on the side of the drain electrode DE to the drain electrode DE is Lgd, it is preferred to form the gate electrode GE so as to satisfy the following equation: $0.05\ \mu m \leq L_F \leq Lgd/2$.

When the $L_F$ is smaller than the above-mentioned range, the effect of dispersing the electric field to two positions weakens, leading to a reduction in the effects of suppressing current collapse, reducing gate leakage, and improving breakdown voltage. When the $L_F$ is greater than the above-mentioned range, on the other hand, the field intensity in the vicinity of the end portion of the gate electrode GE on the side of the drain electrode DE increases due to a decrease in the distance between the gate electrode GE and the drain electrode DE and an effect of improving a breakdown voltage decreases. It is therefore possible to produce effects of suppressing current collapse, reducing gate leakage, and improving breakdown voltage by locating the gate electrode GE so as to fall within the above-mentioned range.

In addition, in the present embodiment, the cap layer CAP has a tapered side surface (sidewall). As shown in FIG. 1, the angle θ between the substrate SUB or the electron supply layer ES and the side surface of the cap layer CAP is less than 90° (θ<90°). Inclining the side surface of the cap layer CAP in such a manner relaxes the electric field in the vicinity of the side surface of the cap layer CAP on the side of the drain electrode DE. For example, the peak electric field when the side surface is inclined can be made smaller than that when the side surface of the cap layer is made vertical (θ=90°). As a result, effects of suppressing current collapse, reducing gate leakage, and improving breakdown voltage can be produced markedly.

Particularly in the constitution of the present embodiment, the cap layer CAP has an inclined side surface on the side of the drain electrode DE. In this portion of the side surface, the thickness of the cap layer CAP changes continuously. The greater the thickness of the cap layer CAP, the smaller the carrier density in a two-dimensional electron gas (two-dimensional electron gas layer). When a high voltage is applied to the side of the drain electrode DE in an OFF state, therefore, a depletion layer is likely to extend in a horizontal direction.

As a result, in the two-dimensional electron gas (two-dimensional electron gas layer) 2DEG of the present embodiment, a depletion layer extends in a horizontal direction from the lower end portion to the upper end portion of the side surface of the cap layer CAP on the side of the drain electrode DE. This means that the electric field distribution in the vicinity of the lower end portion of the side surface of the cap layer CAP on the side of the drain electrode DE extends in a horizontal direction toward the upper end portion of the side surface. Thus, as the electric field distribution becomes wider, the peak electric field decreases. As described above in detail, the tapered side surface of the cap layer CAP can enhance the effects of suppressing current collapse, reducing gate leakage, and improving breakdown voltage.

The angle θ between the electron supply layer ES and the side surface of the cap layer CAP preferably satisfies the following range: 15°≤θ<90°. When the angle θ is excessively smaller than the above range, there is a possibility of an excessive increase in the ON resistance of the resulting field effect transistor. As described above, when the cap layer CAP has an inclined side surface, the two-dimensional electron gas (two-dimensional electron gas layer) 2DEG in this portion has a smaller carrier density and higher resistance compared with a portion where the cap layer CAP has not been formed. With a decrease in the angle θ, this portion having high resistance widens in a horizontal direction, which may presumably cause an increase in ON resistance. At θ=90°, on the other hand, the above-described effects produced by the cap layer CAP having an inclined side surface cannot be expected. Thus, by adjusting the angle θ to fall within a range of 15°≤θ<90°, the effects of suppressing current collapse, reducing gate leakage and improving breakdown voltage can be enhanced while suppressing an increase in ON resistance.

A semiconductor device having a gate electrode GE with an overhang on the side of the drain electrode DE and a cap layer CAP with a tapered side surface as in the present embodiment was studied. As a result, in a field effect transistor with a breakdown voltage of 750V, the leakage current at a drain voltage of 600V was 9 nA/mm and a reduction amount of the maximum drain current due to current collapse was 7%. At θ=90°, the leakage current at a drain voltage of 600V was 15 nA/mm and a reduction amount of the maximum drain current due to current collapse was 9%.

The constitution of the semiconductor device of the present embodiment will next be described more specifically.

The substrate SUB is a semiconductor substrate (single crystal silicon substrate) made of, for example, silicon (Si). As another mode, a sapphire substrate, a silicon carbide (SiC) substrate, or the like can be used as the substrate SUB. A GaN substrate, an AlN substrate, or a diamond substrate can also be used. A substrate obtained by laminating any of these materials on a base can also be used.

The buffer layer BUF is formed in order to relax a difference in lattice constant between the substrate SUB and the channel layer CH. A difference in lattice constant, for example, between silicon (Si) constituting the substrate SUB and gallium nitride (GaN) constituting the channel layer CH can be relaxed by the buffer layer BUF. This means that when the channel layer CH made of gallium nitride (GaN) is formed directly on the substrate SUB made of silicon (Si), many cracks occur in the channel layer CH, which disturbs formation of a good epitaxial growth layer and makes it difficult to manufacture a high electron mobility transistor. The buffer layer BUF for relaxing the lattice is therefore inserted between the substrate SUB and the channel layer CH. Since the buffer layer BUF is thus formed, a good epitaxial growth layer can be formed as the channel layer CH to be formed on the buffer layer BUF and as a result, a high electron mobility transistor can have improved characteristics.

The buffer layer BUF may be any of a gallium nitride (GaN) layer, an aluminum gallium nitride (AlGaN) layer, or an aluminum nitride (AlN) layer, or a film stack of them.

The channel layer CH is made of a nitride semiconductor, preferably a gallium nitride layer made of gallium nitride (GaN). In another mode, an indium gallium nitride (InGaN) layer may be used as the channel layer CH.

In the present embodiment, the channel layer CH is formed on the substrate SUB via the buffer layer BUF. In another mode, a nitride semiconductor substrate made of gallium nitride (GaN), aluminum gallium nitride (AlGaN), or the like may be used as the substrate SUB and in this case, the channel layer CH may be formed while thinning or omitting the buffer layer BUF. This is because when a gallium semiconductor substrate made of gallium nitride (GaN), aluminum gallium nitride (AlGaN), or the like is used as the substrate SUB, the buffer layer BUF or channel layer CH made of gallium nitride or the like can be formed on the nitride semiconductor substrate by lattice matching.

The electron supply layer ES is made of a nitride semiconductor different from a nitride semiconductor for the channel layer CH and it is made of a nitride semiconductor containing aluminum (Al). The electron supply layer ES is, for example, an aluminum gallium nitride layer made of aluminum gallium nitride (AlGaN). Instead of it, InAlN, AlInGaN, or the like can be used.

The channel layer CH which is a semiconductor layer has, directly thereon, the electron supply layer ES which is a semiconductor layer (a semiconductor layer having a band gap different from that of the channel layer CH) having a composition different from that of the channel layer CH. This means that the channel layer CH is in contact with the electron supply layer ES. Therefore, the channel layer CH and the electron supply layer ES have therebetween a heterojunction. The electron supply layer ES is an electron supply layer and functions as a carrier generation region.

The source electrode SE, the drain electrode DE, and the cap layer CAP are each formed on the upper surface (surface) of the electron supply layer ES but they are separated from each other. The source electrode SE and the drain electrode DE are each made of a conductor and are made of, for example, a metal film (a single metal film or a stack of metal films). The source electrode SE and the drain electrode DE are in ohmic contact with the electron supply layer ES.

The cap layer CAP is made of, for example, a p type semiconductor film (for example, GaN). As well as GaN, InGaN, AlGaN, InAlN, AlInGaN, or the like can be used. It is particularly preferred to select a material to give a smaller band gap than that of the material constituting the electron supply layer ES or to select such a composition ratio. It is more preferred to select a material to give a band gap equal to or smaller than that of the material constituting the channel layer CH or select such a composition ratio. Such a combination makes it possible to improve the characteristics of a normally off operation.

As described above, this cap layer CAP has a tapered side surface. More specifically, the angle θ between the substrate SUB or the electron supply layer ES and the side surface of the cap layer CAP is less than 90° (θ<90°).

An insulating film IF has been formed so as to cover the side surface of the cap layer CAP. This insulating film IF has therein an opening portion OA1 from which the upper surface of the cap layer CAP is exposed. The cap layer CAP has, on the upper surface thereof, a gate electrode GE via the opening portion OA1. The gate electrode GE is made of, for example, a metal film (a single metal film or a stack of metal films). In addition, this gate electrode GE extends over from the opening portion OA1 of the insulating film IF to the insulating film IF. As described above, the gate electrode GE overhangs on the side of the drain electrode DE. For example, the distance from the center portion of the opening portion OA1 to the end portion of the gate electrode GE on the side of the drain electrode DE is greater than the distance from the center portion of the opening portion OA1 to the end portion of the gate electrode GE on the side of the source electrode SE.

As the insulating film IF, for example, a silicon nitride (SiN) film can be used. A silicon oxide film ($SiO_2$), a SiON film, an AlN film, a diamond film, a polyimide film, or the like may also be used. A film stack obtained by stacking these materials may also be used. The thickness of the insulating film IF is preferably adjusted to fall within a range of, for example, 20 nm or greater but not greater than 500 nm. Film thicknesses excessively smaller than this range may presumably cause a reduction in dielectric breakdown of the insulating film IF, while those excessively greater than this range may reduce an electric-field relaxing effect in the vicinity of the side surface of the cap layer CAP on the side of the drain electrode DE.

The above-mentioned source electrode SE, drain electrode DE, and gate electrode GE (cap layer CAP) extend in a direction substantially perpendicular to the plane of paper in FIG. 1. As the source electrode SE and the drain electrode DE, a stack of a titanium (Ti) film and an aluminum (Al) film can be used. Alternatively, a material showing low-resistance contact with a group III nitride semiconductor can be selected and used. As the gate electrode GE, a stack of a nickel (Ni) film and a gold (Au) film can be used. Alternatively, a material capable of forming a good Schottky contact with a group III nitride semiconductor can be selected and used.

The semiconductor device (high electron mobility transistor) of the present embodiment has a constitution as described above.

In such a high electron mobility transistor, a two-dimensional electron gas (two-dimensional electron gas layer) 2DEG is produced (formed) in the vicinity of an interface between the channel layer CH and the electron supply layer ES. Described specifically, the band gap of the channel layer CH (gallium nitride (GaN) or indium gallium nitride (InGaN) constituting the channel layer) and the band gap of the electron supply layer ES (aluminum gallium nitride (AlGaN) constituting the electron supply layer) are different from each other. Due to a conduction band offset based on a difference in the band gap and the influence of piezoelectric and spontaneous polarizations present in the electron supply layer ES, a potential well below the Fermi level is formed in the vicinity of the interface between the channel layer CH and the electron supply layer ES. This leads to accumulation of electrons in the potential well and as a result, a two-dimensional electron gas (two-dimensional electron gas layer) 2DEG is produced in the vicinity of the interface between the channel layer CH and the electron supply layer ES.

In a region having the cap layer CAP, however, the two-dimensional electron gas (two-dimensional electron gas layer) 2DEG is not produced. The semiconductor device (high electron mobility transistor) of the present embodiment can keep an OFF state when a positive voltage equal to or greater than the threshold voltage has not been applied to the gate electrode GE and can keep an ON state when a positive voltage equal to or greater than the threshold voltage has been applied to the gate electrode GE.

[Description of Manufacturing Method]

Next, a method of manufacturing the semiconductor device of the present embodiment will be described and the constitution of the semiconductor device will be made clearer referring to FIGS. 2 to 8. FIGS. 2 to 8 are cross-sectional views showing the manufacturing steps of the semiconductor device of the present embodiment.

Figure 2:
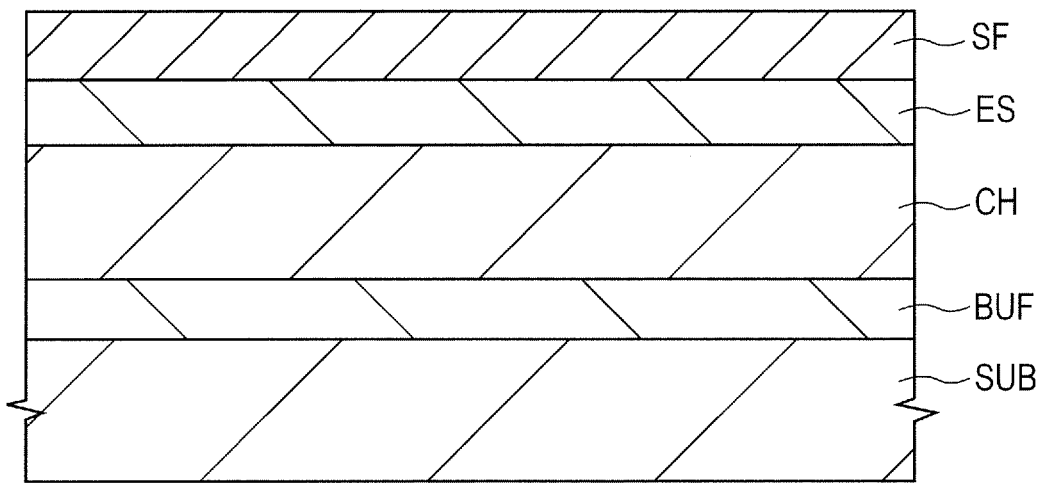
FIG. 2 is a cross-sectional view showing a manufacturing step of the semiconductor device of First Embodiment.

As shown in FIG. 2, a substrate made of, for example, silicon carbide (SiC) is provided as a substrate SUB. In another mode, a sapphire substrate, a single crystal silicon substrate, or the like can be used. As the substrate SUB, a nitride semiconductor substrate made of gallium nitride (GaN), aluminum gallium nitride (AlGaN), or the like can also be used and in this case, a buffer layer BUF can be thinned or omitted because the substrate SUB and a channel layer CH which will be formed later can be lattice matched to each other.

Next, a buffer layer BUF is formed on the substrate SUB. For example, a buffer layer BUF made of an aluminum nitride (AlN) epitaxial layer is formed on the substrate SUB made of silicon carbide (SiC) by making use of MOCVD (metal organic chemical vapor deposition). The buffer layer BUF is formed, for example, for relaxing a difference in lattice constant between the substrate SUB and the channel layer CH formed on the buffer layer BUF.

Next, a channel layer CH is formed on the buffer layer BUF. For example, a channel layer CH made of a gallium nitride (GaN) epitaxial layer is formed on the buffer layer made of aluminum nitride (AlN) by using MOCVD.

Next, an electron supply layer ES is formed on the channel layer CH. For example, an electron supply layer ES made of an AlGaN epitaxial layer is formed on the channel layer CH made of gallium nitride (GaN) by using MOCVD.

Next, a semiconductor film SF which will be a cap layer CAP is formed on the electron supply layer ES. For example, a semiconductor film SF made of a p type gallium nitride (p type GaN) epitaxial layer is formed on the electron supply layer ES made of, for example, AlGaN. As the p type impurity, for example, magnesium (Mg) can be used. The impurity concentration is, for example, about $5 \times 10^{18}$ cm$^{-3}$.

It is to be noted that each of the epitaxial layers is an epitaxial layer in a Ga face mode.

Figure 3:
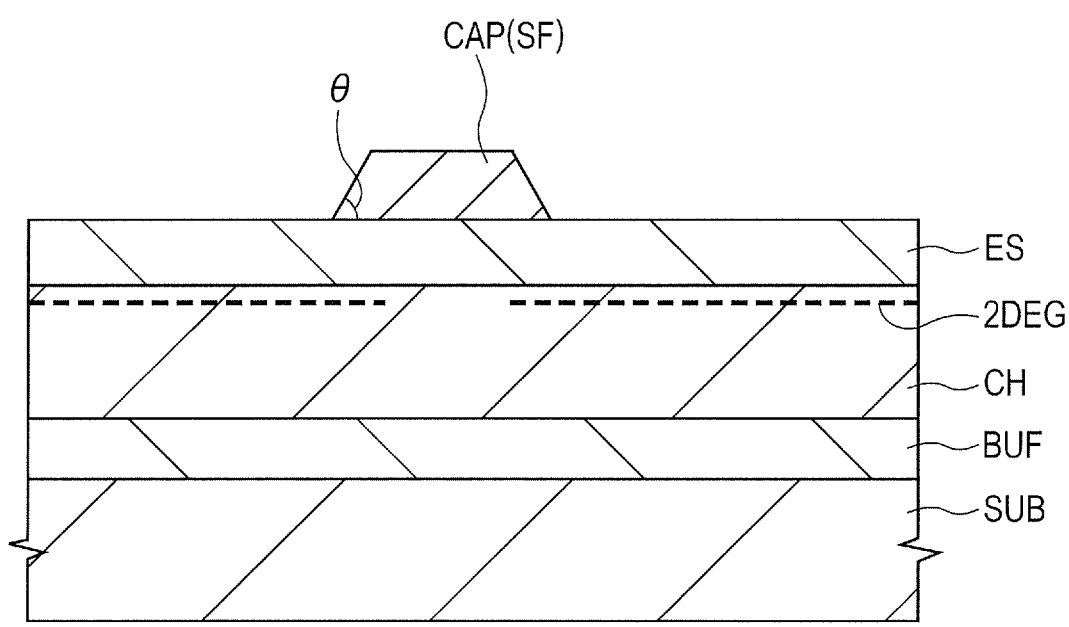
FIG. 3 is a cross-sectional view showing a manufacturing step of the semiconductor device of First Embodiment following the manufacturing step of FIG. 2.

Next, as shown in FIG. 3, the semiconductor film SF is patterned to form a cap layer CAP. For example, a photoresist film (not illustrated) is formed on the semiconductor film SF, followed by exposure and development to leave the photoresist film only in a formation region of the cap layer CAP. Then, with this photoresist film as a mask, the semiconductor film SF is etched to form a cap layer CAP. For example, the semiconductor film SF is etched using, for example, inductively coupled plasma (ICP) dry etching. Then, the photoresist film which has remained on the cap layer CAP is removed by ashing or the like. The step from formation of this photoresist film to removal thereof is called "patterning".

During this step, the etching conditions are adjusted to taper the side surface of the cap layer CAP. This means that, as shown in the drawing, the angle θ between the substrate SUB or the electron supply layer ES and the side surface of the cap layer CAP is made less than 90° (θ<90°). Etching may be conducted under the following conditions. For example, the photoresist film serving as a mask is etched to reduce its size and the end portions of the photoresist film are retreated gradually. This makes it possible to increase the etching amount at the end portions of the photoresist film and taper the side surface of the cap layer CAP. It is also possible to taper the side surface of the cap layer CAP by etching with a mixture of an isotropic etching species in an anisotropic etching species. It is further possible to taper the side surface of the cap layer by adjusting the conditions such as gas species and pressure.

Next, heat treatment is conducted to eliminate a hydrogen atom from a p type dopant in the cap layer CAP to activate the cap layer CAP. The heat treatment is conducted at 750° C. in a nitrogen atmosphere for about 10 minutes.

By this heat treatment, due to the action of polarization charges generated at the interface between the channel layer CH and the electron supply layer ES, a two-dimensional electron gas (two-dimensional electron gas layer) 2DEG is produced in the region from which the cap layer CAP has been removed by etching. In the region in which the cap layer CAP has been formed, on the other hand, negative charges are produced in the cap layer CAP due to ionization of an acceptor. In the region where the cap layer CAP has been formed, a two-dimensional electron gas (two-dimensional electron gas layer) 2DEG is not produced at the interface between the channel layer CH and the electron supply layer ES in thermal equilibrium. In the semiconductor device (high electron mobility transistor) of the present embodiment, an OFF state can be kept when a positive voltage equal to or greater than the threshold voltage has not been applied to the gate electrode GE and an ON state can be kept when a positive voltage equal to or greater than the threshold voltage has been applied to the gate electrode GE. Thus, in the semiconductor device of the present embodiment, "normally off operation with positive threshold voltage" can be achieved.

Figure 4:
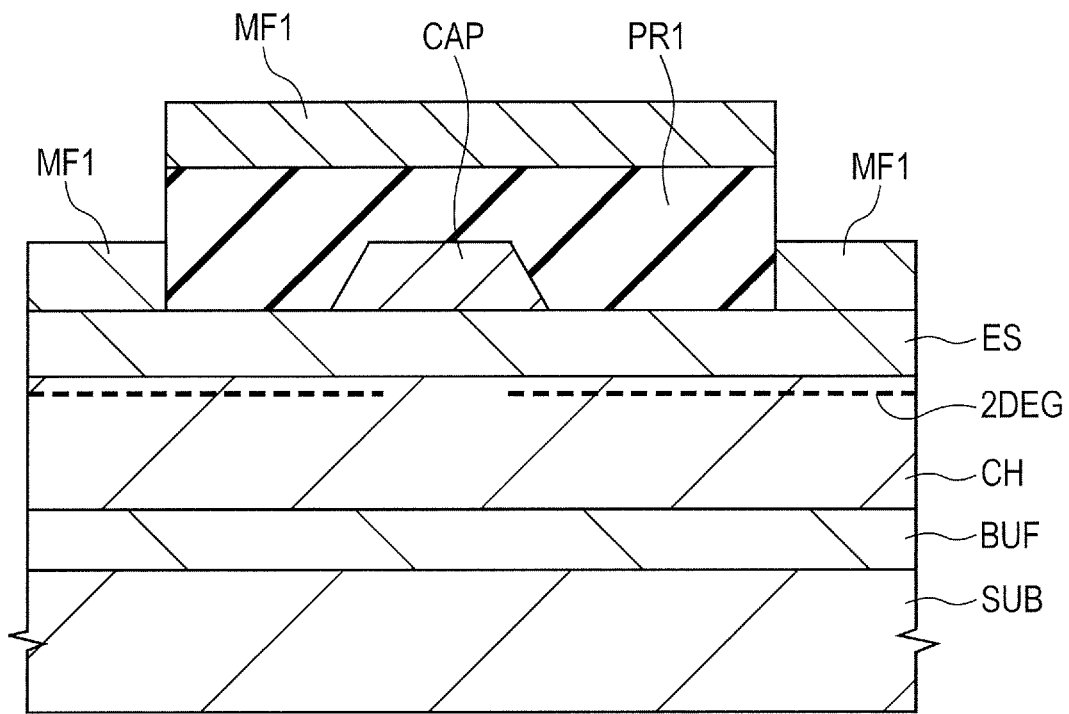
FIG. 4 is a cross-sectional view showing a manufacturing step of the semiconductor device of First Embodiment following the manufacturing step of FIG. 3.

Next, a source electrode SE and a drain electrode DE are formed with a space therebetween on both sides of the cap layer CAP. These source electrode SE and drain electrode DE are formed using, for example, the lift-off process. As shown in FIG. 4, a photoresist film PR1 is formed on the electron supply layer ES including the upper surface of the cap layer CAP, followed by exposure and development to remove the photoresist film PR1 on the formation regions of the source electrode SE and the drain electrode DE. In FIG. 4, the photoresist film PR1 is left on the cap layer CAP and in the regions on both sides thereof.

Next, a metal film MF1 is formed on the electron supply layer ES including the upper surface of the photoresist film PR1. As a result, the metal film MF1 is formed directly on the electron supply layer ES in the formation regions of the source electrode SE and the drain electrode DE. In the other region, the metal film MF1 is formed on the photoresist film PR1.

The metal film MF1 is comprised of a stack of, for example, a titanium (Ti) film and an aluminum (Al) film formed on the titanium film (Ti/Al). The films constituting the metal film MF1 can each be formed, for example, by vacuum deposition.

Figure 5:
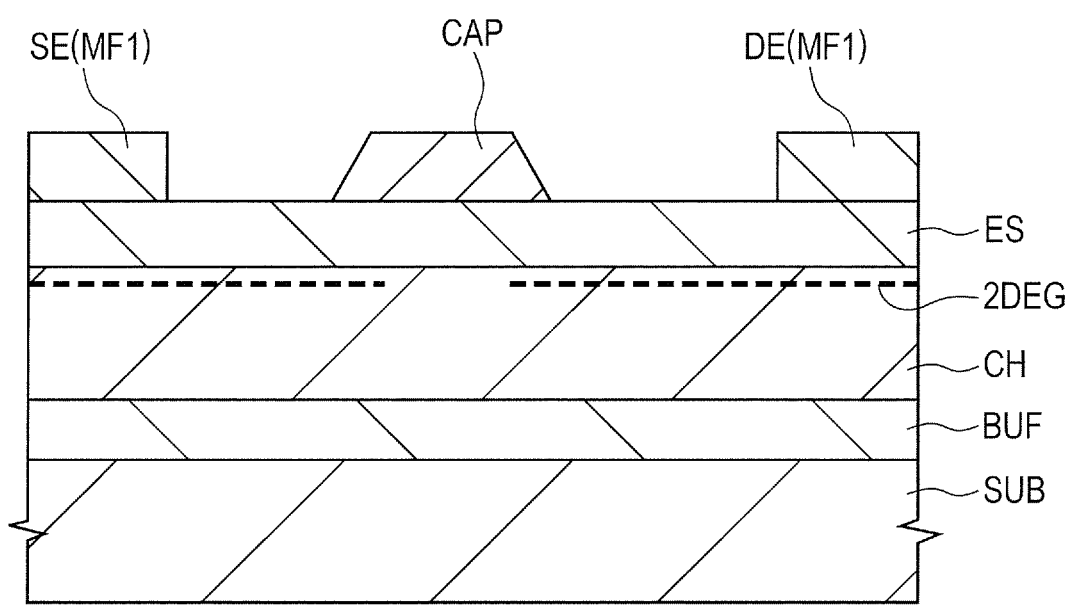
FIG. 5 is a cross-sectional view showing a manufacturing step of the semiconductor device of First Embodiment following the manufacturing step of FIG. 4.

Next, the photoresist film PR1 is removed. During this removal, together with the photoresist film PR1, the metal film MF1 formed on the photoresist film PR1 is also removed and only the metal films MF1 (source electrode SE and drain electrode DE) in direct contact with the upper surface of the electron supply layer ES remain (FIG. 5).

Next, the substrate SUB is subjected to heat treatment (alloy treatment). The heat treatment is conducted, for example, at 600° C. for about 1 minute in a nitrogen atmosphere. By this heat treatment, the source electrode SE can be brought into an ohmic contact with the channel layer CH in which the two-dimensional electron gas (two-dimensional electron gas layer) 2DEG has been formed. Similarly, an ohmic contact between the drain electrode DE and the channel layer CH can be achieved. In other words, each of the source electrode SE and the drain electrode DE is electrically coupled to the two-dimensional electron gas (two-dimensional electron gas layer) 2DEG.

Next, although not illustrated, an element isolation region is formed by ion implantation with nitrogen (N) or the like in order to isolate between elements.

Figure 6:
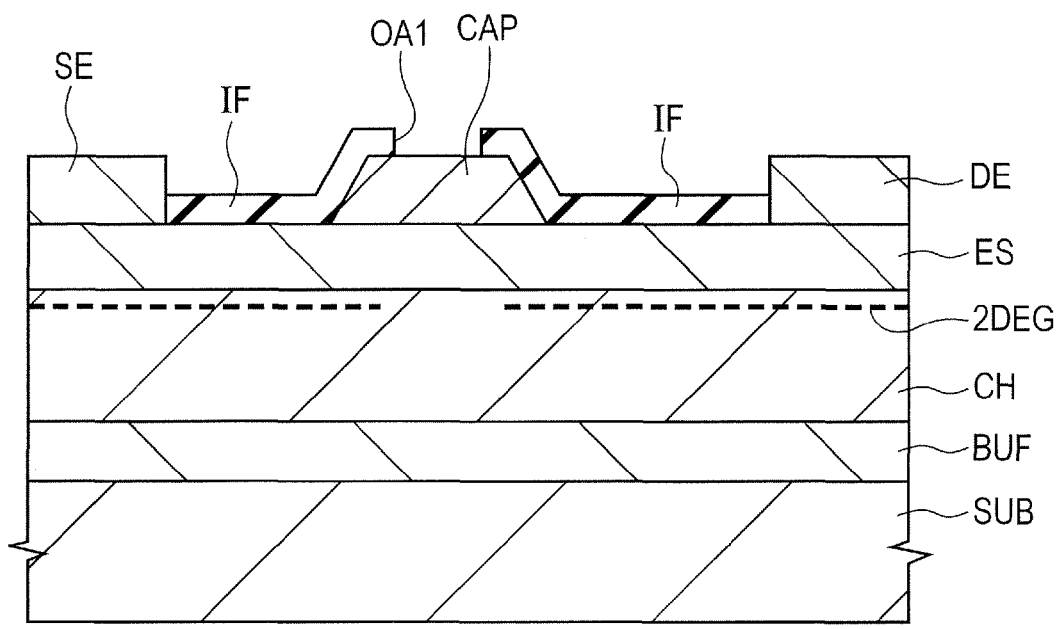
FIG. 6 is a cross-sectional view showing a manufacturing step of the semiconductor device of First Embodiment following the manufacturing step of FIG. 5.

Next, as shown in FIG. 6, an insulating film IF having an opening portion OA1 is formed. For example, the insulating film IF is formed on the upper surface of the electron supply layer ES including the upper surfaces of the cap layer CAP, the source electrode SE, and the drain electrode DE. As the insulating film IF, for example, a silicon nitride (SiN) film having a film thickness of about 100 nm is formed using plasma enhanced chemical vapor deposition (PECVD) or the like. Next, the insulating film IF is patterned to form the opening portion OA1 on the cap layer CAP. During this patterning, the insulating films IF on the source electrode SE and the drain electrode DE may be removed.

Figure 7:
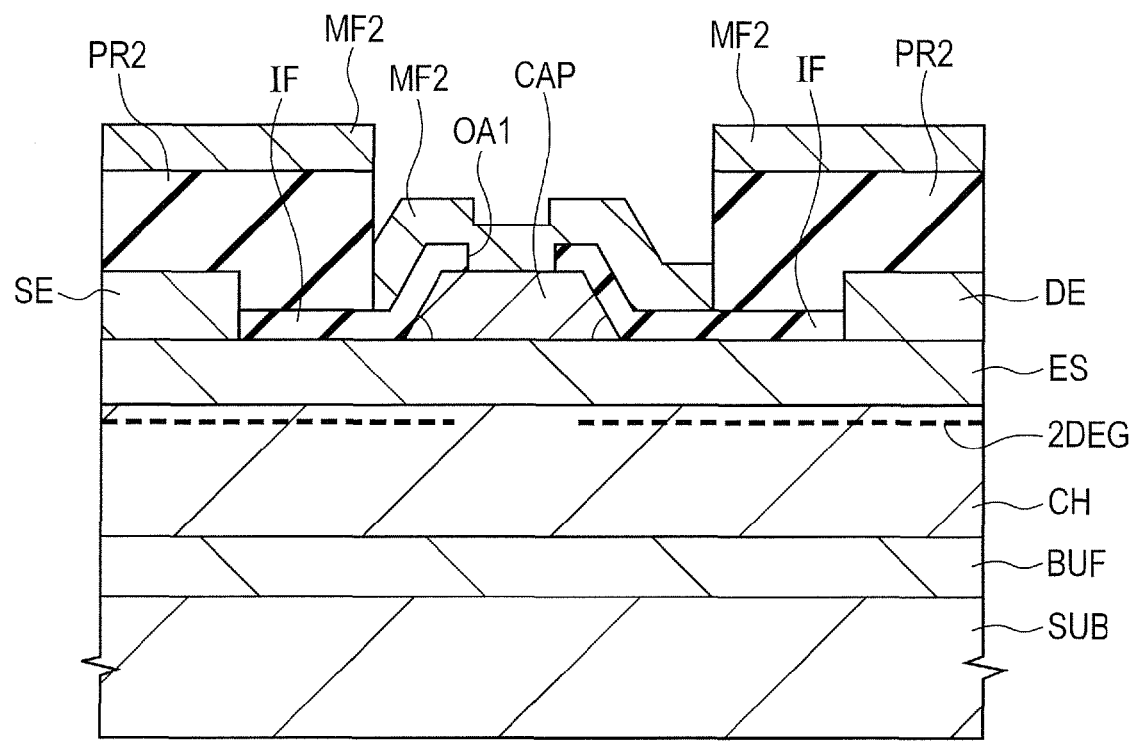
FIG. 7 is a cross-sectional view showing a manufacturing step of the semiconductor device of First Embodiment following the manufacturing step of FIG. 6.

Next, a gate electrode GE extending over from the cap layer CAP to the insulating film IF is formed. This gate electrode GE is formed, for example, by using the lift-off process. As shown in FIG. 7, a photoresist film PR2 is formed on the cap layer CAP, the insulating film IF, the source electrode SE, and the drain electrode DE, followed by exposure and development to remove the photoresist film PR2 on the formation region of the gate electrode GE. In FIG. 7, the photoresist film PR2 is removed from the opening portion CA1 and the vicinity thereof.

Next, a metal film MF2 is formed on the photoresist film PR2, the cap layer CAP, and the insulating film IF. The metal film MF2 is therefore formed directly in a region extending over from the opening portion CA1 to the insulating film IF. In the other regions, the metal film MF2 is formed on the photoresist film PR2.

The metal film MF2 is comprised of, for example, a film stack of a nickel (Ni) film and a gold (Au) film formed on the nickel film (Ni/Au). Each of the films constituting the metal film MF2 can be formed using, for example, vapor deposition.

Figure 8:
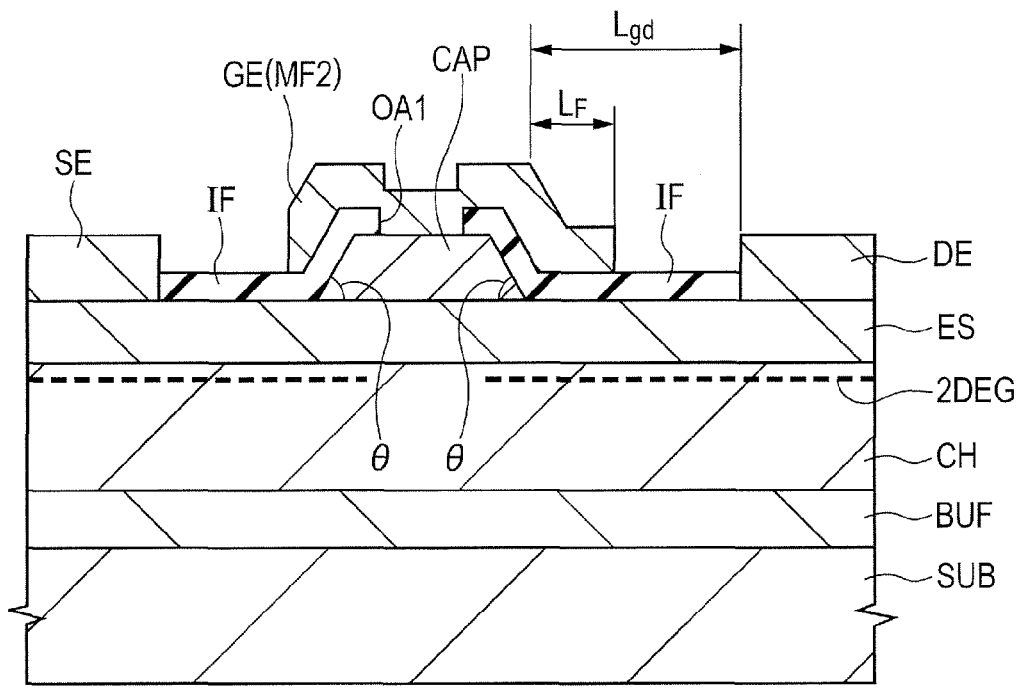
FIG. 8 is a cross-sectional view showing a manufacturing step of the semiconductor device of First Embodiment following the manufacturing step of FIG. 7.

Net, the photoresist film PR2 is removed. During this removal, together with the photoresist film PR2, the metal film MF2 formed on the photoresist film PR2 is removed to leave only the metal film MF2 (gate electrode GE) extending over from the opening portion OA1 on the cap layer CAP to the insulating film IF (FIG. 8).

By the above-mentioned steps, the semiconductor device of the present embodiment is substantially completed. In the above-mentioned steps, the gate electrode GE, the source electrode SE, and the drain electrode DE are formed by the lift-off process, but these electrodes may be formed by patterning of a metal film.

Second Embodiment

In First Embodiment, the p type cap layer CAP is formed as a single layer, but this p type cap layer CAP may have a stacked structure.

A semiconductor device of the present embodiment will next be described in detail referring to a drawing.

[Description of Structure]

Figure 9:
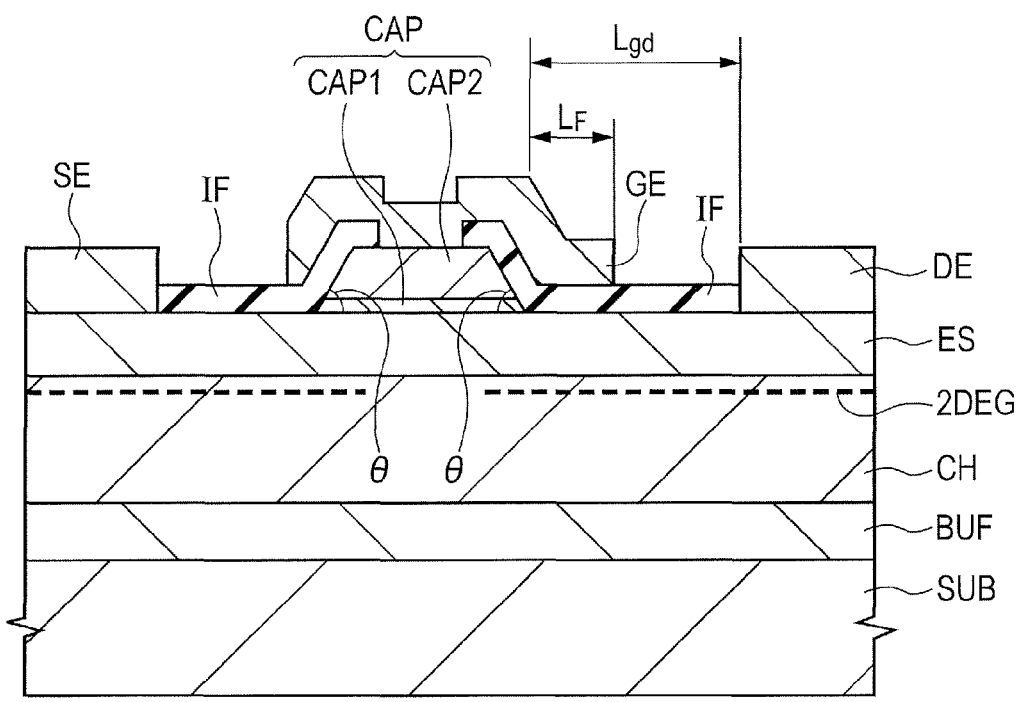
FIG. 9 is a cross-sectional view showing the constitution of a semiconductor device of Second Embodiment.

FIG. 9 is a cross-sectional view showing the constitution of the semiconductor device of the present embodiment. The semiconductor device shown in FIG. 9 is a field effect transistor (high electron mobility transistor) using a nitride semiconductor and has a constitution similar to that of the semiconductor device shown in First Embodiment (FIG. 1) except for the p type cap layer CAP.

As shown in FIG. 9, the semiconductor device of the present embodiment has, similar to that of First Embodiment, a buffer layer BUF on a substrate SUB, a channel layer CH made of a nitride semiconductor on the buffer layer BUF, and an electron supply layer ES made of a nitride semiconductor on the channel layer CH. The electron supply layer ES has thereon a gate electrode GE via a cap layer CAP. The cap layer CAP has thereon an insulating film IF having an opening portion OA1 and the upper surface of the cap layer CAP is brought into contact with the gate electrode GE via the opening portion OA1. The cap layer CAP has, on the side surface thereof, the gate electrode GE via the insulating film IF. A two-dimensional electron gas (two-dimensional electron gas layer) 2DEG is produced (formed) in the vicinity of the interface between the channel layer CH and the electron supply layer ES. In the region in which the cap layer CAP has been formed, however, the two-dimensional electron gas (two-dimensional electron gas layer) 2DEG is not produced.

Also in the present embodiment, similar to First Embodiment, the gate electrode GE overhangs on the side of the drain electrode DE. For example, the distance between the center portion of the opening portion OA1 to the end portion of the gate electrode GE on the side of the drain electrode DE is greater than the distance from the center portion of the opening portion OA1 to the end portion of the gate electrode GE on the side of the source electrode SE.

Supposing that the overhang distance from the end portion of the cap layer CAP on the side of the drain electrode DE to the end portion of the gate electrode GE on the side of the drain electrode DE is $L_F$ and the distance from the end portion of the cap layer CAP on the side of the drain electrode DE to the drain electrode DE is Lgd, the gate electrode GE is preferably formed so as to satisfy the following range: $0.05\ \mu m \leq L_F \leq Lgd/2$.

Also in the present embodiment, similar to First Embodiment, the cap layer CAP has a tapered side surface. Described specifically, as shown in the drawing, the angle θ between the substrate SUB or the electron supply layer ES and the side surface of the cap layer CAP is less than 90° (θ<90°). By inclining the side surface of the cap layer CAP in such a manner, the electric field in the vicinity of the side surface of the cap layer CAP on the side of the drain electrode DE is relaxed. For example, the peak electric field in this case can be made smaller than that when the cap layer has a vertical side surface (θ=90°). This makes it possible to produce effects of suppressing current collapse, reducing gate leakage, and improving breakdown voltage.

The angle θ between the electron supply layer ES and the side surface of the cap layer CAP is preferably adjusted to fall within the following range: $15° \leq \theta < 90°$.

Thus, the present embodiment can also produce effects similar to those of First Embodiment.

Further, in the present embodiment, the cap layer CAP is comprised of a first layer (lower layer) CAP1 formed on the electron supply layer ES and a second layer (upper layer) CAP2 formed on the first layer. The concentration of a p type impurity (acceptor) of the first layer CAP1 is set lower than the concentration of a p type impurity of the second layer CAP2.

Thus, by setting the concentration of the p type impurity of the first layer (lower layer) CAP1 relatively lower, the peak electric field in the vicinity of the lower end portion of the cap layer CAP on the side of the drain electrode DE is reduced. Details of it will next be described.

First, the concentration of the acceptor of the first layer (lower layer) CAP1 is low so that the density of negative charges attributable to the acceptor decreases. This leads to a decrease in the field intensity in a depletion layer spreading in the lower layer (first layer CAP 1) of the cap layer CAP.

Since the two-dimensional electron gas (two-dimensional electron gas layer) 2DEG uses electrons as carriers, it behaves like an n type semiconductor layer. On the other hand, the electron supply layer ES is an i type (insulation type) so that a stacked portion of the two-dimensional electron gas (two-dimensional electron gas layer) 2DEG, the electron supply layer ES, and the cap layer CAP inevitably forms a pin junction.

Therefore, with a decrease in the field intensity of the first layer (lower layer) CAP1 of the cap layer CAP constituting the p portion of the pin junction, the electric field of the portion of the two-dimensional electron gas (two-dimensional electron gas layer) 2DEG constituting the n portion of the pin junction decreases.

This results in a reduction in the field intensity in the vicinity of the lower end portion of the side surface of the cap layer AP on the side of the drain electrode DE.

Thus, the present embodiment can further improve the effects of First Embodiment for suppressing current collapse, reducing gate leakage, and improving breakdown voltage.

[Description of Manufacturing Method]

The semiconductor device of the present embodiment can be manufactured in a manner similar to that employed for the manufacture of the semiconductor device of First Embodiment (FIG. 1).

As in First Embodiment, a buffer layer BUF is formed on a substrate SUB, followed by formation of a channel layer CH on the buffer layer. Next, an electron supply layer ES is formed on the channel layer CH, followed by formation of a semiconductor film (SF) which will be a cap layer CAP on the electron supply layer.

For example, a semiconductor film (SF) made of a p type gallium nitride (p type GaN) epitaxial layer is formed on an electron supply layer ES made of AlGaN by using MOCVD. During the film formation using MOCVD, by increasing the flow rate of a raw material gas to be introduced into a film as a p type impurity, it is possible to form a semiconductor film (SF) made of a film stack of a first film having a low p type impurity concentration and a second film having a p type impurity concentration higher than that of the first film.

By patterning this semiconductor film (SF) in a manner similar to that employed in First Embodiment, it is possible to form a cap layer CAP comprised of a first layer CAP1 and a second layer CAP2 formed on the first layer CAP1, wherein the first layer CAP1 has a p type impurity concentration lower than the p type impurity concentration of the second layer CAP2.

Next, similar to First Embodiment, a source electrode SE and a drain electrode DE are formed with a space therebetween on both sides of the cap layer CAP. After formation of an insulating film IF having therein an opening portion OA1, a gate electrode GE is formed which extends over from the cap layer CAP to the insulating film IF.

By the above-mentioned steps, the semiconductor device of the present embodiment is substantially completed.

FIG. 9 clearly shows a boundary of the cap layer CAP between the first layer CAP 1 and the second layer CAP2, but the cap layer CAP may have a constitution in which the concentration of the acceptor gradually increases from the lower layer portion toward the upper layer portion. Even if the concentration of the acceptor shows a continuous change and the boundary between layers is not clear, the above-mentioned effects can be produced insofar as the concentration of the acceptor of the cap layer AP on the side of the electron supply layer ES is set lower than the concentration of the acceptor on the side of the gate electrode GE. In other words, similar effects can be produced even when the p type impurity concentration in the lower layer portion of the cap layer CAP is lower than the p type impurity concentration in the upper layer portion.

A semiconductor device, as that in the present embodiment, equipped with a gate electrode GE having an overhang on the side of the drain electrode DE and a cap layer CAP having a tapered side surface and having a lower p type impurity concentration in the lower layer portion was studied. As a result, in a field effect transistor having a breakdown voltage of 750V, the leakage current at a drain voltage of 600V was 4 nA/mm and a reduction amount of the maximum drain current due to current collapse was 4%.

Third Embodiment

In Second Embodiment, the p type cap layer CAP has a two-layer structure, but this p type cap layer CAP may have a three-layer structure.

The semiconductor device of the present embodiment will next be described in detail referring to a drawing.

[Description of Structure]

Figure 10:
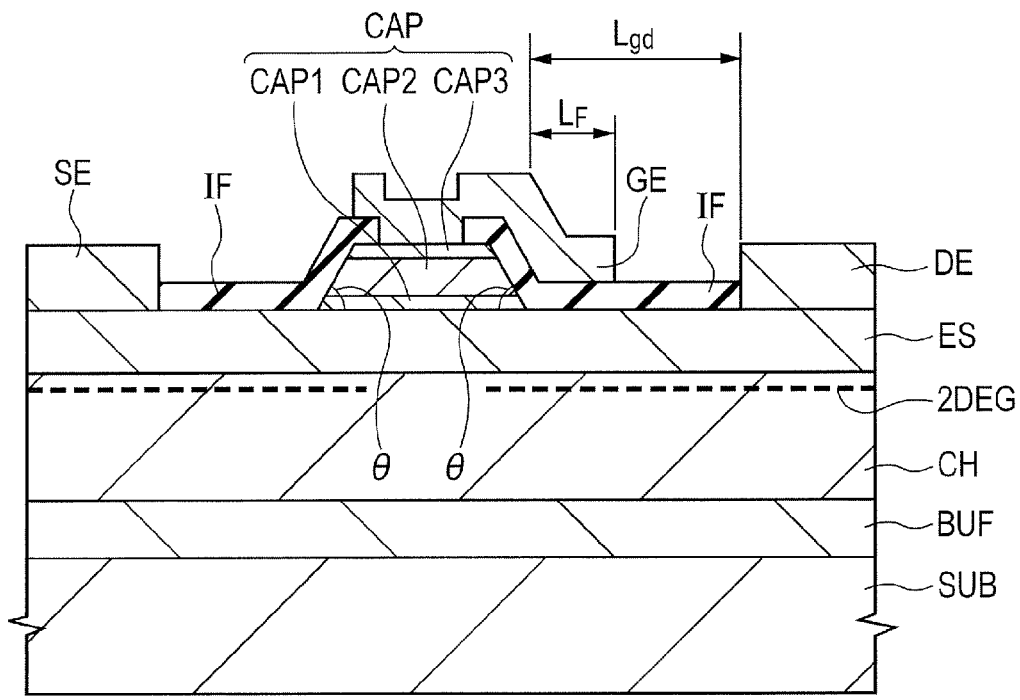
FIG. 10 is a cross-sectional view showing the constitution of a semiconductor device of Third Embodiment.

FIG. 10 is a cross-sectional view showing the constitution of the semiconductor device according to the present embodiment. The semiconductor device shown in FIG. 10 is a field effect transistor using a nitride semiconductor and it has a constitution similar to that of the semiconductor device shown in First Embodiment (FIG. 1) except for the constitution of the p type cap layer CAP.

As shown in FIG. 10, the semiconductor device of the present embodiment has, similar to that of First Embodiment, a buffer layer BUF on a substrate SUB, a channel layer CH made of a nitride semiconductor on the buffer layer BUF, and an electron supply layer ES made of a nitride semiconductor on the channel layer CH. The electron supply layer ES has thereon a gate electrode GE via a cap layer CAP. The cap layer CAP has thereon an insulating film IF having an opening portion OA1 and the upper surface of the cap layer CAP is brought into contact with the gate electrode GE via the opening portion OA1. The cap layer CAP has, on the side surface thereof, the gate electrode GE via the insulating film IF. A two-dimensional electron gas (two-dimensional electron gas layer) 2DEG is produced (formed) in the vicinity of the interface between the channel layer CH and the electron supply layer ES. In the region in which the cap layer CAP has been formed, the two-dimensional electron gas (two-dimensional electron gas layer) 2DEG is not produced.

Also in the present embodiment, similar to First Embodiment, the gate electrode GE has an overhang on the side of the drain electrode DE. For example, the distance between the center portion of the opening portion OA1 to the end portion of the gate electrode GE on the side of the drain electrode DE is greater than the distance from the center portion of the opening portion OA1 to the end portion of the gate electrode GE on the side of the source electrode SE.

Supposing that the overhang distance from the end portion of the cap layer CAP on the side of the drain electrode DE to the end portion of the gate electrode GE on the side of the drain electrode DE is $L_F$ and the distance from the end portion of the cap layer CAP on the side of the drain electrode DE to the drain electrode DE is Lgd, the gate electrode GE is preferably formed so as to satisfy the following range: $0.05\ \mu m \leq L_F \leq Lgd/2$.

Also in the present embodiment, similar to First Embodiment, the cap layer CAP has a tapered side surface. Described specifically, as shown in the drawing, the angle θ between the substrate SUB or the electron supply layer ES and the side surface of the cap layer CAP is less than 90° (θ<90°). By inclining the side surface of the cap layer CAP in such a manner, the electric field in the vicinity of the side surface of the cap layer CAP on the side of the drain electrode DE is relaxed. For example, the peak electric field in this case can be made smaller than that when the cap layer has a vertical side surface (θ=90°). This makes it possible to produce effects of suppressing current collapse, reducing gate leakage, and improving breakdown voltage.

The angle θ between the electron supply layer ES and the side surface of the cap layer CAP is preferably adjusted to fall within the following range: $15° \leq θ < 90°$.

Thus, the present embodiment can also produce effects similar to those of First Embodiment.

Further, in the present embodiment, the cap layer CAP is comprised of a first layer (lower layer) CAP1 formed on the electron supply layer ES, a second layer (middle layer, center layer) CAP2 formed on the first layer, and a third layer (upper layer) CAP3 formed on the second layer. The concentration of the p type impurity (acceptor) of each of the first layer CAP1 and the third layer (upper layer) CAP3 is set lower than the concentration of the p type impurity of the second layer (middle layer, center layer) CAP2.

By setting the concentration of the p type impurity of the first layer (lower layer) CAP1 lower than the concentration of the p type impurity of the second layer (middle layer, center layer) CAP2, the peak electric field in the vicinity of the lower end portion of the side surface of the cap layer CAP on the side of the drain electrode DE is reduced as described in Second Embodiment.

Further, the present embodiment can enhance the effect of suppressing current collapse compared with that of Second Embodiment.

Described specifically, by setting the concentration of the p type impurity (acceptor) of the third layer (upper layer) CAP3 lower than the concentration of the p type impurity of the second layer (middle layer, center layer) CAP2, injection of electrons to the surface level present in the surface of the cap layer CAP from the gate electrode GE is suppressed.

This means that by setting the concentration of the p type impurity of the third layer (upper layer) CAP3 lower than the concentration of the p type impurity of the second layer (middle layer, center layer) CAP2, the density of negative charges attributable to the acceptor decreases, leading to a reduction in field intensity in a depletion layer spreading in the cap layer CAP. Thus, when the field intensity in the third layer (upper layer) CAP3 of the cap layer CAP in contact with the gate electrode GE is reduced, injection of electrons to the surface level of the cap layer CAP from the gate electrode GE is suppressed.

As a result, the present embodiment can further enhance the effect of suppressing current collapse compared with Second Embodiment.

In the present embodiment, the overhang amount of the gate electrode GE on the side of the source electrode SE is made smaller than that of First Embodiment (FIG. 1) or Second Embodiment (FIG. 9). More specifically, the gate electrode GE extends over the side surface of the cap layer CAP on the side of the drain electrode DE via the insulating film IF but it is not placed on the side surface of the cap layer on the side of the source electrode SE.

Thus, by reducing the overhang amount of the gate electrode GE on the side of the source electrode SE, parasitic capacitance associated with the gate electrode GE can be reduced and the resulting transistor can have an increased operation rate. In addition, by reducing the overhang amount of the gate electrode GE on the side of the source electrode SE, the distance between the source electrode SE and the cap layer CAP can be reduced. For example, the distance between the source electrode SE and the cap layer CAP can be made smaller than the distance between the drain electrode DE and the cap layer CAP. Decreasing the distance between the source electrode SE and the cap layer CAP can reduce the ON resistance and also reduce an operation loss.

[Description of Manufacturing method]

The semiconductor device of the present embodiment can be manufactured in a manner similar to that employed for the semiconductor device of First Embodiment (FIG. 1).

As in First Embodiment, a buffer layer BUF is formed on a substrate SUB and then a channel layer CH is formed on the buffer layer. Then, an electron supply layer ES is formed on the channel layer CH, followed by the formation of a semiconductor film (SF) which will be a cap layer CAP on the electron supply layer.

A semiconductor film (SF) made of a p type gallium nitride (p type GaN) epitaxial layer is formed on the electron supply layer ES made of, for example, AlGaN by using MOCVD. During film formation using MOCVD, a flow rate of a raw material gas to be introduced into the film as a p type impurity is increased and after that, the flow rate of the raw material gas is decreased. This makes it possible to form a semiconductor film (SF) made of a stack of a first film having a low p type impurity concentration, a second film having a p type impurity concentration higher than that of the first film, and a third film having a p type impurity concentration lower than that of the second film.

By patterning the resulting semiconductor film (SF) as in First Embodiment, it is possible to form the cap layer CAP comprised of the first layer CAP1, the second layer CAP2 formed on the first layer CAP1, and the third layer CAP3 formed on the second layer CAP2, wherein the first layer CAP1 and the third layer CAP3 each have a p type impurity concentration lower than the p type impurity concentration of the second layer CAP2.

Next, as in First Embodiment, a source electrode SE and a drain electrode DE are formed with a space therebetween on both sides of the cap layer CAP. After formation of an insulating film IF having an opening portion OA1, a gate electrode GE extending over from the cap layer CAP to the insulating film IF is formed.

By the above-mentioned steps, the semiconductor device of the present embodiment is substantially completed.

FIG. 10 clearly shows boundaries of the cap layer CAP between the first layer CAP 1 and the second layer CAP2 and between the second layer CAP2 and the third layer CAP3, but the cap layer CAP may have a constitution in which the concentration of the acceptor gradually increases from the lower layer portion of the cap layer CAP toward the middle layer portion thereof and the concentration of the acceptor gradually decreases from the middle layer portion of the cap layer CAP toward the upper layer portion thereof. Even if the concentration of the acceptor shows a continuous change and the boundary between layers is not clear, the above-mentioned effects can be produced insofar as the concentration of the acceptor of the cap layer AP on the side of the electron supply layer ES and the concentration of the acceptor on the side of the gate electrode GE are made lower than the concentration of the acceptor in the middle layer portion. In other words, similar effects can be produced even when the p type impurity concentrations in the lower layer portion and the upper layer portion of the cap layer CAP are lower than the p type impurity concentration in the middle layer portion located between the lower layer portion and the upper layer portion.

A semiconductor device, as that in the present embodiment, equipped with a gate electrode GE having an overhang on the side of the drain electrode DE and a cap layer CAP having a tapered side surface and having a lower p type impurity concentration in the lower and upper layer portions thereof was studied. As a result, in a field effect transistor having a breakdown voltage of 750V, the leakage current at a drain voltage of 600V was 1 nA/mm and a reduction amount of the maximum drain current due to current collapse was 2%.

Fourth Embodiment

In First Embodiment, the opening portion OA1 is made smaller than the upper surface of the cap layer CAP and the insulating film IF is left at the outer periphery of the upper surface of the cap layer CAP. In the present embodiment, on the other hand, the opening portion OA1 is made almost equal to the entire upper surface of the cap layer CAP. In other words, the insulating film IF is completely removed from the upper surface of the cap layer CAP.

The semiconductor device of the present embodiment will next be described in detail referring to a drawing.

[Description of Structure]

Figure 11:
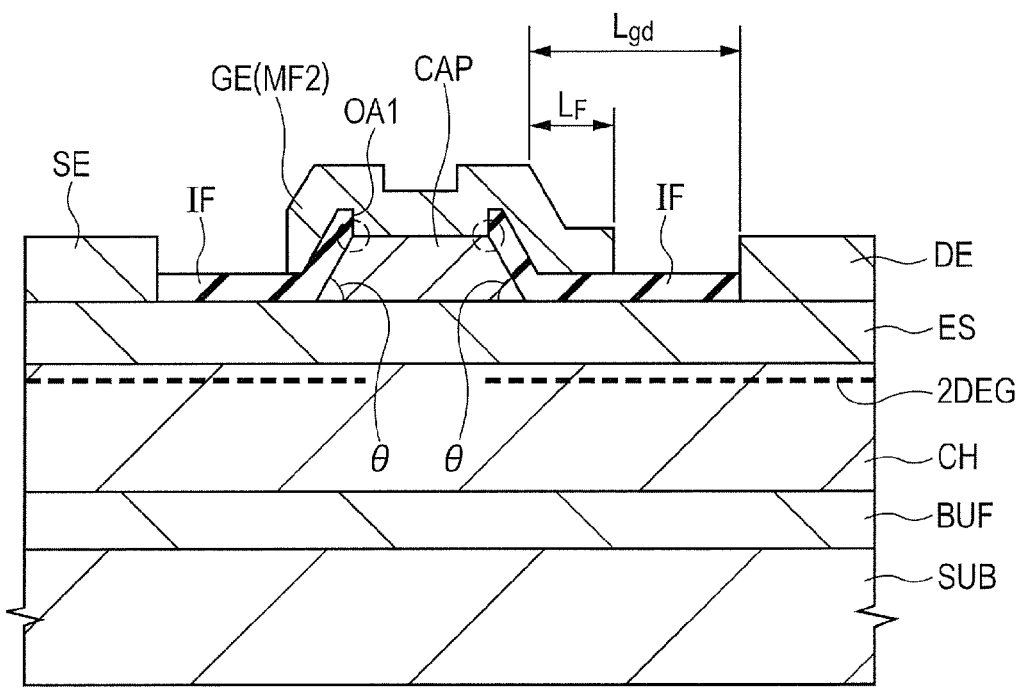
FIG. 11 is a cross-sectional view showing the constitution of a semiconductor device of Fourth Embodiment.

FIG. 11 is a cross-sectional view showing the constitution of the semiconductor device of the present embodiment. The semiconductor device shown in FIG. 11 is a field effect transistor (high electron mobility transistor) using a nitride semiconductor and has a constitution similar to that of the semiconductor device shown in First Embodiment (FIG. 1) except for the insulating film IF.

As shown in FIG. 11, the semiconductor device of the present embodiment has, similar to that of First Embodiment, a buffer layer BUF on a substrate SUB, a channel layer CH made of a nitride semiconductor on the buffer layer BUF, and an electron supply layer ES made of a nitride semiconductor on the channel layer CH. The electron supply layer ES has thereon a gate electrode GE via a cap layer CAP. The cap layer CAP has thereon an insulating film IF having an opening portion OA1 and the upper surface of the cap layer CAP is brought into contact with the gate electrode GE via the opening portion OA1. The cap layer CAP has, on the side surface thereof, the gate electrode GE via the insulating film IF. A two-dimensional electron gas (two-dimensional electron gas layer) 2DEG is produced (formed) in the vicinity of the interface between the channel layer CH and the electron supply layer ES. In the region in which the cap layer CAP has been formed, the two-dimensional electron gas (two-dimensional electron gas layer) 2DEG is not produced.

Also in the present embodiment, similar to First Embodiment, the gate electrode GE has an overhang on the side of the drain electrode DE. For example, the distance between the center portion of the opening portion OA1 to the end portion of the gate electrode GE on the side of the drain electrode DE is greater than the distance from the center portion of the opening portion OA1 to the end portion of the gate electrode GE on the side of the source electrode SE.

Supposing that the overhang distance from the end portion of the cap layer CAP on the side of the drain electrode DE to the end portion of the gate electrode GE on the side of the drain electrode DE is $L_F$ and the distance from the end portion of the cap layer CAP on the side of the drain electrode DE to the drain electrode DE is Lgd, the gate electrode GE is preferably formed so as to satisfy the following range: $0.05\ \mu m \leq L_F \leq Lgd/2$.

Also in the present embodiment, similar to First Embodiment, the cap layer CAP has a tapered side surface. Described specifically, as shown in the drawing, the angle θ between the substrate SUB or the electron supply layer ES and the side surface of the cap layer CAP is less than 90° (θ<90°). By inclining the side surface of the cap layer CAP in such a manner, the electric field in the vicinity of the side surface of the cap layer CAP on the side of the drain electrode DE is relaxed. For example, the peak electric field can be made smaller than that when the cap layer has a vertical side surface (θ=90°). This makes it possible to produce effects of suppressing current collapse, reducing gate leakage, and improving breakdown voltage.

The angle θ between the electron supply layer ES and the side surface of the cap layer CAP is preferably adjusted to fall within the following range: $15° \leq θ < 90°$.

Thus, the present embodiment can also produce effects similar to those of First Embodiment.

Further, in the present embodiment, the entire upper surface of the cap layer CAP and the opening portion OA1 are made equal in area and the insulating film IF is not left at the outer periphery of the upper surface of the cap layer CAP.

Figure 12:
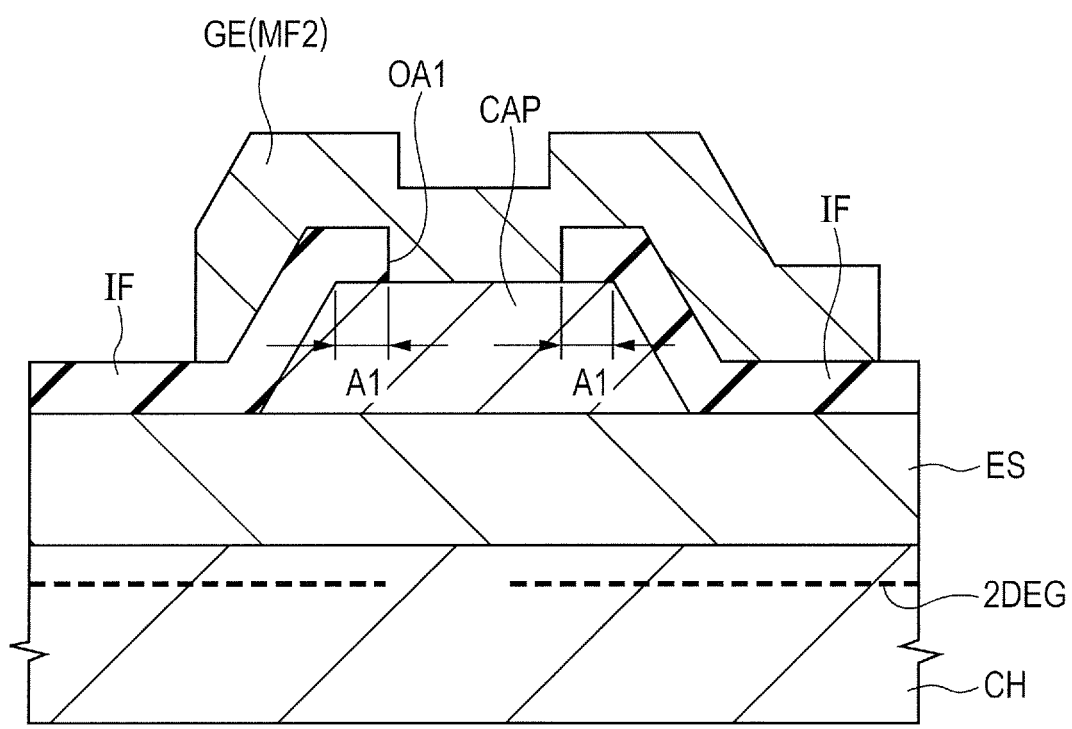
FIG. 12 is a partially enlarged view of the vicinity of a gate electrode portion of the semiconductor device of First Embodiment.

FIG. 12 is a partially enlarged view of the vicinity of the gate electrode GE of the semiconductor device of First Embodiment. As shown in FIG. 12, when the upper surface of the cap layer CAP and the gate electrode GE have therebetween the insulating film IF, there is a possibility of a reduction in carrier density in the two-dimensional electron gas (two-dimensional electron gas layer) 2DEG immediately below the insulating film. When an overlapping area A1 of the upper surface of the cap layer CAP with the insulating film IF becomes too large (for example, 0.3 μm or greater), an increase in ON resistance may occur due to a reduction in the carrier density.

In the present embodiment, on the other hand, it is possible to suppress an increase in the ON resistance by making the area of the entire upper surface of the cap layer CAP and that of the opening portion OA1 substantially equal to each other.

Thus, the present embodiment is effective for suppressing current collapse, reducing gate leakage, and improving breakdown voltage as in First Embodiment and in addition, can reduce the ON resistance.

[Description of Manufacturing Method]

The semiconductor device of the present embodiment can be manufactured in a manner similar to that employed for the semiconductor device of First Embodiment (FIG. 1).

As in First Embodiment, a buffer layer BUF is formed on a substrate SUB and a channel layer CH is formed on the buffer layer. Next, an electron supply layer ES is formed on the channel layer CH, followed by the formation of a semiconductor film (SF) which will be a cap layer CAP on the electron supply layer.

For example, a semiconductor film (SF) made of a p type gallium nitride (p type GaN) epitaxial layer is formed on an electron supply layer E made of AlGaN by using MOCVD. The resulting semiconductor film (SF) is patterned as in First Embodiment to form a cap layer CAP.

Next, as in First Embodiment, a source electrode SE and a drain electrode DE are formed with a space therebetween on both sides of the cap layer CAP and an insulating film IF is formed on the upper surface of the electron supply layer ES including the upper surfaces of the cap layer CAP, the source electrode SE, and the drain electrode DE. As the insulating film IF, for example, a silicon nitride (SiN) film having a film thickness of about 100 nm is formed using plasma enhanced chemical vapor deposition or the like. Next, the insulating film IF is patterned to form an opening portion OA1 on the cap layer CAP. During this step, etching is conducted while adjusting the shape of a photoresist film serving as a mask so that the upper surface of the cap layer CAP and the opening portion OA1 have the same shape. In this etching, the insulating films IF on the source electrode SE and the drain electrode DE may be removed.

Next, as in First Embodiment, a gate electrode GE extending over from the cap layer CAP to the insulating film IF is formed.

By the above-described steps, the semiconductor device of the present embodiment is substantially completed.

FIG. 11 shows the case where the upper surface of the cap layer CAP and the opening portion OA1 have the same shape, but mask misalignment or etching error is expected to occur in the manufacturing process. It is therefore preferred to design the semiconductor device so that the overlapping area A1 of the upper surface of the cap layer CAP with the insulating film IF is 0.3 μm or less, more preferably 0.2 μm or less.

Fifth Embodiment

In the present embodiment, the gate electrode GE is comprised of two portions.

The semiconductor device of the present embodiment will next be described in detail referring to a drawing.

[Description of Structure]

Figure 13:
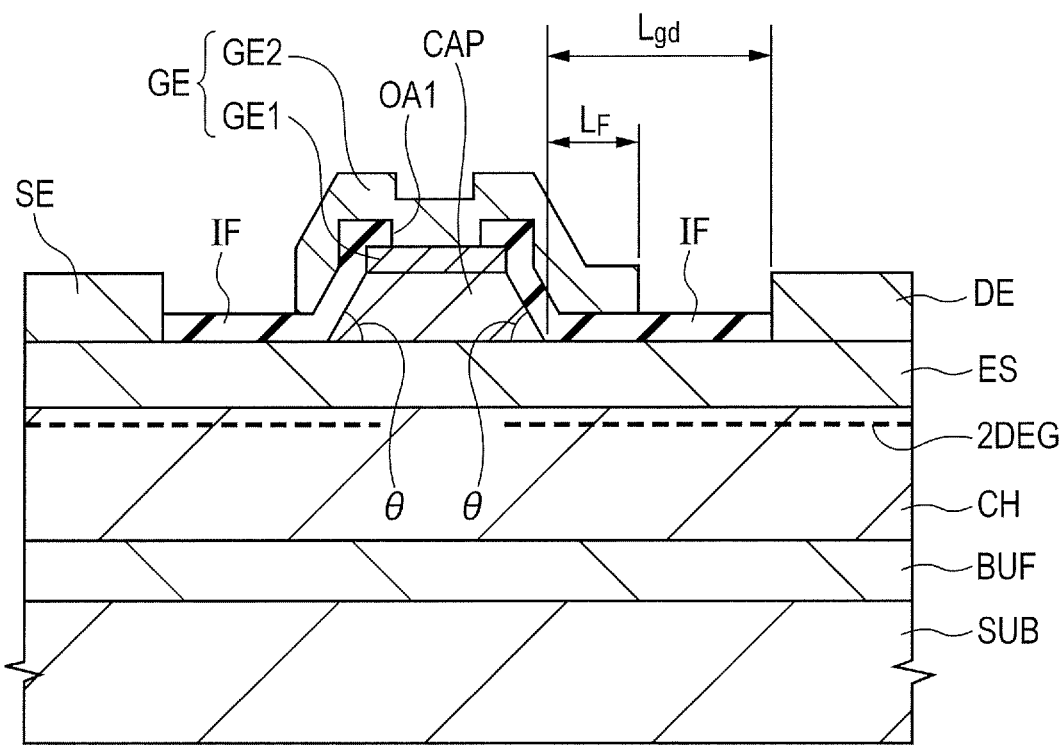
FIG. 13 is a cross-sectional view showing the constitution of a semiconductor device of Fifth Embodiment.

FIG. 13 is a cross-sectional view showing the constitution of the semiconductor device of the present embodiment. The semiconductor device shown in FIG. 13 is a field effect transistor (high electron mobility transistor) using a nitride semiconductor.

As shown in FIG. 13, the semiconductor device of the present embodiment has, similar to that of First Embodiment, a buffer layer BUF on a substrate SUB, a channel layer CH made of a nitride semiconductor on the buffer layer BUF, and an electron supply layer ES made of a nitride semiconductor on the channel layer BUF. It has, on the electron supply layer ES, a gate electrode GE via a cap layer CAP. This gate electrode GE is comprised of a first gate electrode portion GE1 and a second gate electrode portion GE2. The first gate electrode portion GE1 lies on the cap layer CAP. The first gate electrode portion GE1 and the side surface of the cap layer CAP have thereon an insulating film IF having an opening portion OA1 and the upper surface of the first gate electrode portion GE1 and the second gate electrode portion GE2 are brought into contact with each other via the opening portion OA1. The cap layer CAP has, on the side surface thereof, the second gate electrode portion GE2 via the insulating film IF. In the vicinity of the interface between the channel layer CH and the electron supply layer ES, a two-dimensional electron gas (two-dimensional electron gas layer) 2DEG is produced (formed). In the region where the cap layer CAP has been formed, however, the two-dimensional electron gas (two-dimensional electron gas layer) 2DEG is not produced.

Also in the present embodiment, similar to First Embodiment, the second gate electrode portion GE2 overhangs on the side of the drain electrode DE. For example, the distance between the center portion of the opening portion OA1 to the end portion of the second gate electrode portion GE2 on the side of the drain electrode DE is greater than the distance from the center portion of the opening portion OA1 to the end portion of the second gate electrode GE2 on the side of the source electrode SE.

Supposing that the overhang distance from the end portion of the cap layer CAP on the side of the drain electrode DE to the end portion of the second gate electrode portion GE2 on the side of the drain electrode DE is $L_F$ and the distance from the end portion of the cap layer CAP on the side of the drain electrode DE to the drain electrode DE is Lgd, the gate electrode GE is preferably formed so as to satisfy the following range: $0.05\ \mu m \leq L_F \leq Lgd/2$.

Also in the present embodiment, similar to First Embodiment, the cap layer CAP has a tapered side surface. Described specifically, as shown in the drawing, the angle θ between the substrate SUB or the electron supply layer ES and the side surface of the cap layer CAP is less than 90° (θ<90°). By inclining the side surface of the cap layer CAP in such a manner, the electric field in the vicinity of the side surface of the cap layer CAP on the side of the drain electrode DE is relaxed. For example, the peak electric field can be made smaller than that when the cap layer has a vertical side surface (θ=90°). This makes it possible to produce effects of suppressing current collapse, reducing gate leakage, and improving breakdown voltage.

The angle θ between the electron supply layer ES and the side surface of the cap layer CAP is preferably adjusted to fall within the following range: 15°≤θ<90°.

Thus, the present embodiment can also produce effects similar to those of First Embodiment.

Further in the present embodiment, the gate electrode GE is comprised of two portions, that is, the first gate electrode portion GE1 and the second gate electrode portion GE2 and the upper surface of the cap layer CAP is covered with the first gate electrode portion GE1 without placing the insulating film IF between the upper surface of the cap layer CAP and the first gate electrode portion GE1. As a result, similar to Fourth Embodiment, it is possible to avoid a reduction in the carrier density of the two-dimensional electron gas (two-dimensional electron gas layer) 2DEG which will otherwise occur due to the influence of the insulating film IF between the upper surface of the cap layer CAP and the gate electrode GE.

Thus, the present embodiment is effective for suppressing current collapse, reducing gate leakage, and improving breakdown voltage as in First Embodiment and in addition, can reduce the ON resistance.

[Description of Manufacturing Method]

Next, referring to FIGS. 14 to 18, the manufacturing method of the semiconductor device of the present embodiment will be described and at the same time, the constitution of the semiconductor device will be made clearer. FIGS. 14 to 18 are cross-sectional views showing the manufacturing steps of the semiconductor device of the present embodiment, respectively.

Figure 14:
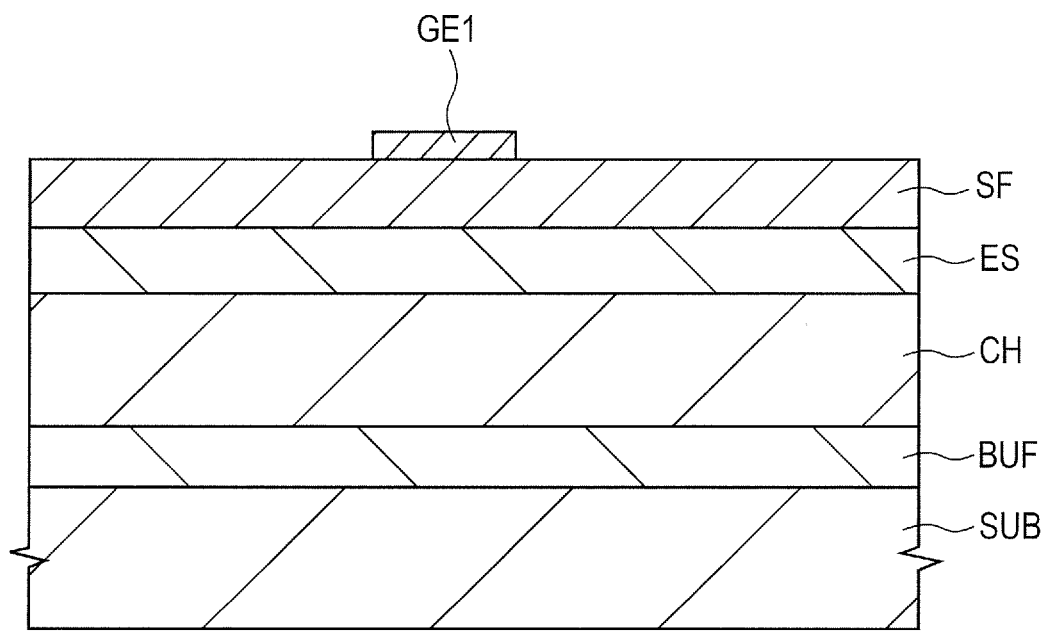
FIG. 14 is a cross-sectional view showing a manufacturing step of the semiconductor device of Fifth Embodiment.

As in First Embodiment, a buffer layer BUF is formed on a substrate SUB shown in FIG. 14 and a channel layer CH is formed on the buffer layer. Next, an electron supply layer ES is formed on the channel layer CH, followed by the formation of a semiconductor film (SF) which will be a cap layer CAP on the electron supply layer.

For example, a semiconductor film (SF) made of a p type gallium nitride (p type GaN) epitaxial layer is formed on an electron supply layer E made of AlGaN by using MOCVD.

Next, in the present embodiment, as shown in FIG. 14, a metal film which will be a first gate electrode portion GE1 is formed on the semiconductor film SF. As the metal film, for example, a film stack of a titanium (Ti) film and an aluminum (Al) film formed on the titanium film is formed using vacuum deposition. As the metal film, a single layer film of a metal selected from aluminum, titanium, tungsten, molybdenum, nickel, or the like or a film stack thereof may be used. The first gate electrode portion GE1 may be comprised of a silicide or nitride film of a metal such as aluminum, titanium, tungsten, molybdenum, or nickel. The metal film is then patterned to form the first gate electrode portion GE1.

Figure 15:
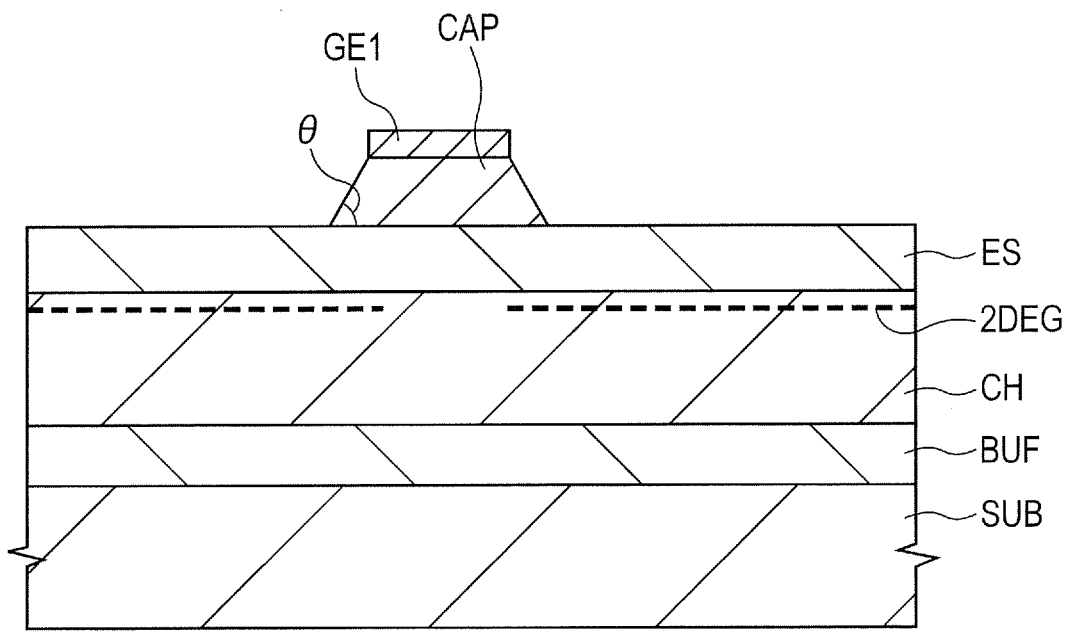
FIG. 15 is a cross-sectional view showing a manufacturing step of the semiconductor device of Fifth Embodiment following the manufacturing step of FIG. 14.

Next, as shown in FIG. 15, with the first gate electrode portion GE1 as a mask, the semiconductor film SF is patterned to form a cap layer CAP. Etching of the semiconductor film SF is conducted using, for example, inductively coupled plasma dry etching. During this step, the etching conditions are adjusted to taper the side surface of the cap layer CAP. This means that, as shown in the drawing, the angle θ between the substrate SUB or the electron supply layer ES and the side surface of the cap layer CAP is made less than 90° (θ<90°). Etching may be conducted under the following conditions. For example, the size of the first gate electrode portion GE1 serving as a mask is reduced by etching and the end portions of the first gate electrode portion GE1 are retreated gradually. This makes it possible to increase the etching amount of the underlying cap layer CAP at the end portions of the first gate electrode portion GE1 and taper the side surface of the cap layer CAP. The side surface of the cap layer CAP can also be tapered by etching with a mixture of an isotropic etching species in an anisotropic etching species. Alternatively, the side surface of the cap layer CAP can be tapered by adjusting the conditions such as gas species and pressure.

Next, heat treatment is conducted to eliminate a hydrogen atom from a p type dopant in the cap layer CAP to activate the cap layer CAP. This heat treatment is conducted to produce a two-dimensional electron gas (two-dimensional electron gas layer) 2DEG. The heat treatment is conducted at 750° C. in a nitrogen atmosphere for about 10 minutes.

Figure 16:
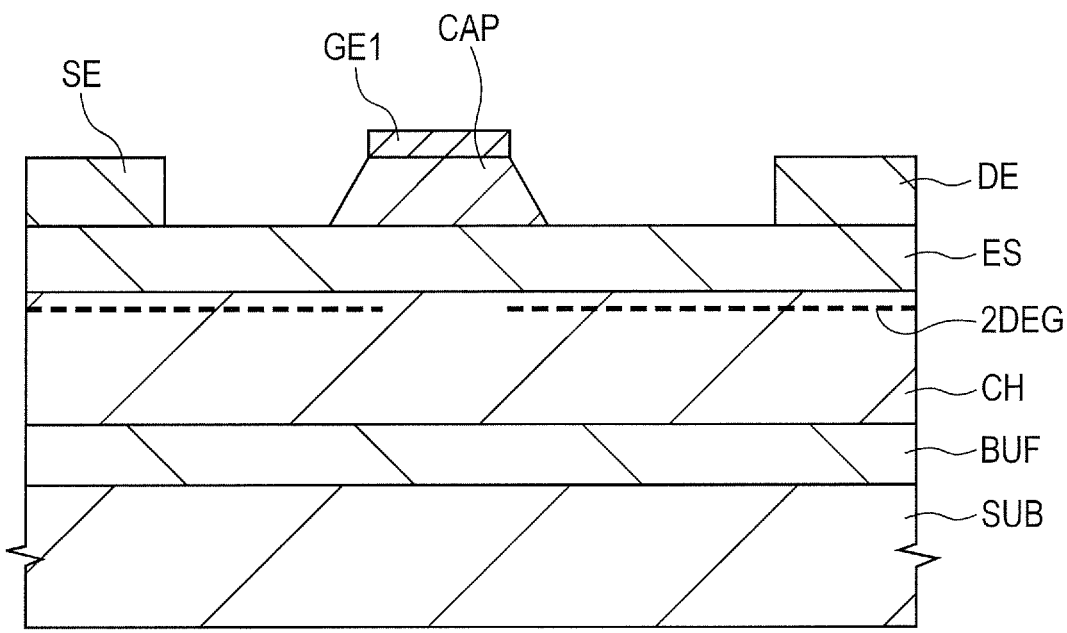
FIG. 16 is a cross-sectional view showing a manufacturing step of the semiconductor device of Fifth Embodiment following the manufacturing step of FIG. 15.

Next, as shown in FIG. 16, a source electrode SE and a drain electrode DE are formed. The source electrode SE and the drain electrode DE can be formed by using the lift-off process as in First Embodiment.

Figure 17:
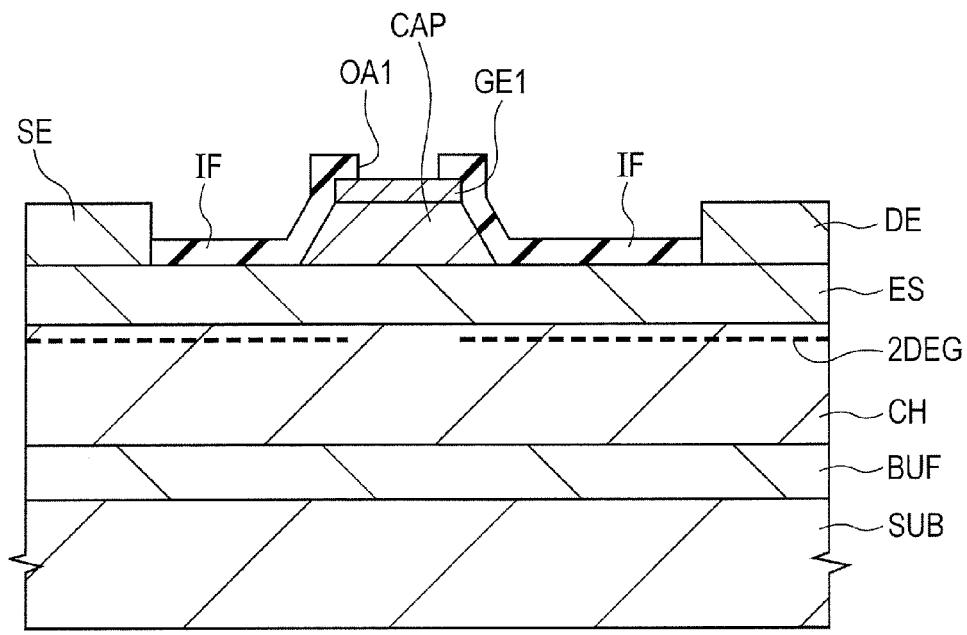
FIG. 17 is a cross-sectional view showing a manufacturing step of the semiconductor device of Fifth Embodiment following the manufacturing step of FIG. 16.

Next, as shown in FIG. 17, an insulating film IF is formed on the upper surface of the electron supply layer ES including the upper surfaces of the cap layer CAP, the source electrode SE, and the drain electrode DE. As the insulating film IF, for example, a silicon nitride (SiN) film having a thickness of about 100 nm is formed using plasma enhanced chemical vapor deposition or the like. Next, the insulating film IF is patterned to form an opening portion OA1 on the cap layer CAP. In this case, different from Fourth Embodiment, an overlapping area between the upper surface of the first gate electrode portion GE1 and the insulating film IF may become large because the cap layer CAP has thereon the first gate electrode portion GE1. This means that the insulating film IF may remain at the outer periphery of the upper surface of the first gate electrode portion GE1. When the opening portion OA1 is formed in the insulating film IF, therefore, alignment of the upper surface of the cap layer CAP and the opening portion OA1 requiring precise control as described in Fourth Embodiment is not necessary. Thus, a high-performance semiconductor device can be manufactured using such simple steps.

Figure 18:
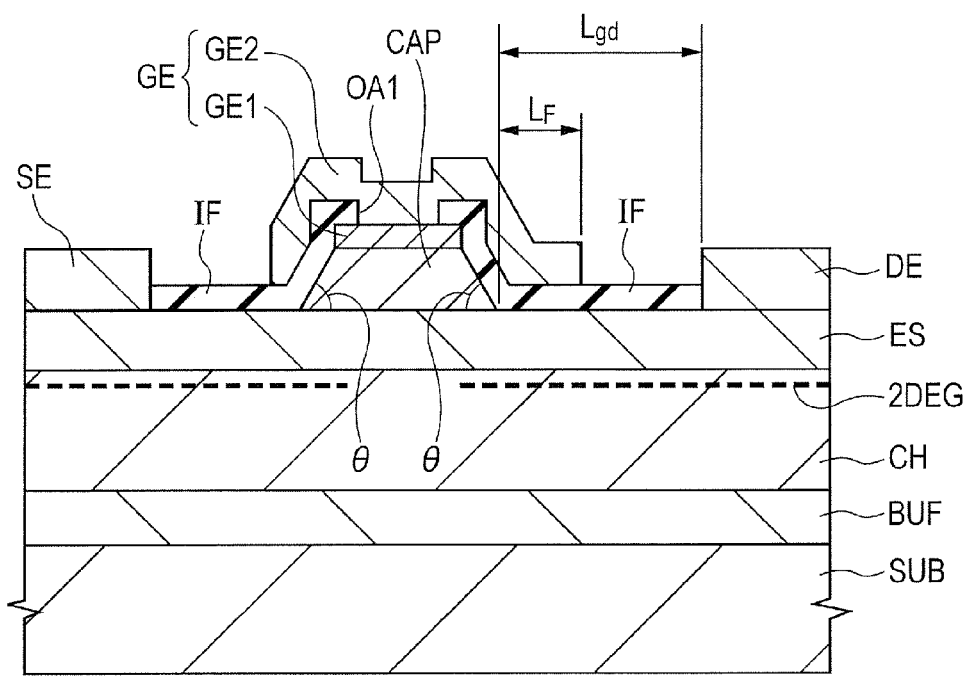
FIG. 18 is a cross-sectional view showing a manufacturing step of the semiconductor device of Fifth Embodiment following the manufacturing step of FIG. 17.

Next, as shown in FIG. 18, a second gate electrode portion GE2 extending over from the first gate electrode portion GE1 to the insulating film IF is formed. This second gate electrode portion GE2 can be formed using, for example, the lift-off process. As a metal film constituting the second gate electrode portion GE2, for example, a film stack of a nickel (Ni) film and a gold (Au) film formed on the nickel film can be used. Each film can be formed using, for example, vapor deposition.

By the above-mentioned steps, the semiconductor device of the present embodiment is substantially completed. In the above-mentioned steps, the second gate electrode portion GE2, the source electrode SE, and the drain electrode DE are formed using the lift-off process, but these electrodes may be formed by patterning a metal film instead.

Sixth Embodiment

In Fifth Embodiment, the shape (planar shape) of the cap layer CAP in a planar view and the shape (planar shape) of the first gate electrode portion GE1 in a planar view are made the same. In the present embodiment, on the other hand, the planar shape of the first gate electrode portion GE1 is made greater than the planar shape of the cap layer CAP.

The semiconductor device of the present embodiment will next be described in detail referring to a drawing.

[Description of Structure]

Figure 19:
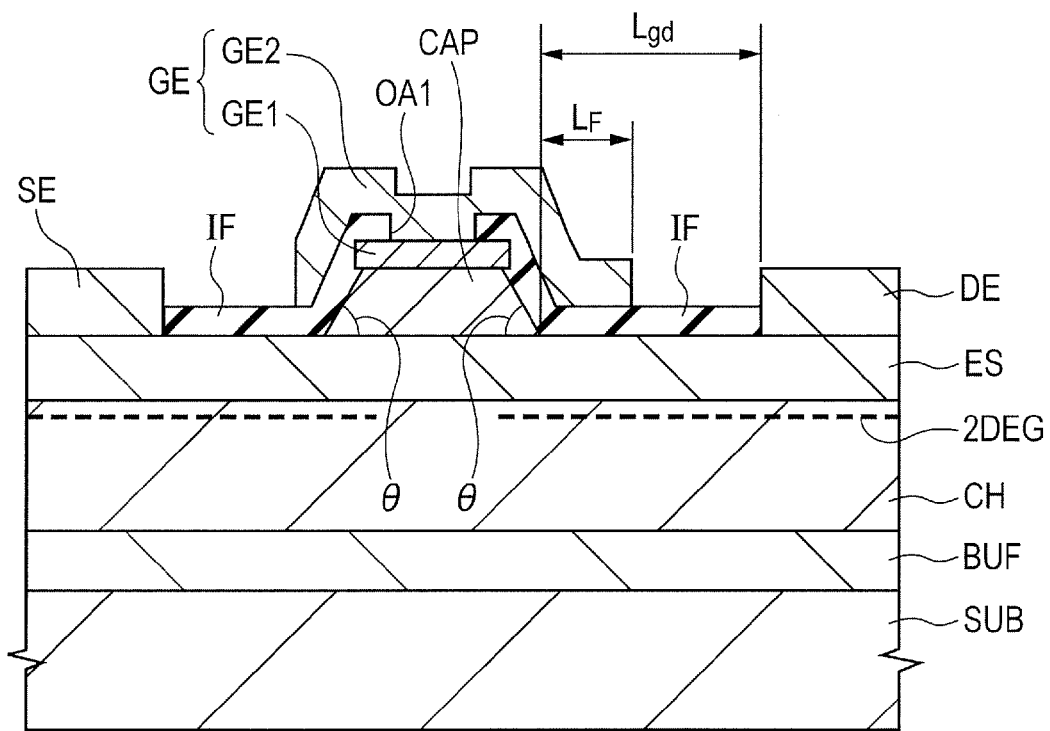
FIG. 19 is a cross-sectional view showing the constitution of a semiconductor device of Sixth Embodiment.

FIG. 19 is a cross-sectional view showing the constitution of the semiconductor device of the present embodiment. The semiconductor device shown in FIG. 19 is a field effect transistor (high electron mobility transistor) using a nitride semiconductor.

As shown in FIG. 19, the semiconductor device of the present embodiment has, similar to that of First Embodiment, a buffer layer BUF on a substrate SUB, a channel layer made of a nitride semiconductor on the buffer layer BUF, and an electron supply layer ES made of a nitride semiconductor on the channel layer CH. The electron supply layer ES has thereon a gate electrode GE via a cap layer CAP. This gate electrode GE is comprised of a first gate electrode portion GE1 and a second gate electrode portion GE2. The first gate electrode portion GE1 lies on the cap layer CAP, but the planar shape of the first gate electrode portion GE1 is greater than that of the upper surface of the cap layer CAP and the side surface of the cap layer CAP is retreated from the end portion of the first gate electrode portion GE1. In other words, the cap layer CAP has, above the side surface thereof, a protruding end portion of the first gate electrode portion GE1.

The first gate electrode portion GE1 and the cap layer CAP have, on the respective side surfaces thereof, an insulating film IF having an opening portion OA1 and the upper surface of the first gate electrode portion GE1 and the second gate electrode portion GE2 are brought into contact with each other via the opening portion OA1. The cap layer has, on the side surface thereof, the second gate electrode portion GE2 via the insulating film IF. In the vicinity of the interface between the channel layer CH and the electron supply layer ES, a two-dimensional electron gas (two-dimensional electron gas layer) 2DEG is produced (formed). In the region having the cap layer CAP, however, the two-dimensional electron gas (two-dimensional electron gas layer) 2DEG is not produced.

In the present embodiment, the second gate electrode portion GE2 overhangs on the side of the drain electrode DE as in First Embodiment. For example, the distance between the center portion of the opening portion OA1 to the end portion of the second gate electrode portion GE2 on the side of the drain electrode DE is greater than the distance from the center portion of the opening portion OA1 to the end portion of the second gate electrode portion GE2 on the side of the source electrode SE.

Supposing that the overhang distance from the end portion of the cap layer CAP on the side of the drain electrode DE to the end portion of the second gate electrode portion GE on the side of the drain electrode DE is $L_F$ and the distance from the end portion of the cap layer CAP on the side of the drain electrode DE to the drain electrode DE is Lgd, the gate electrode GE is preferably formed so as to satisfy the following range: $0.05 \, \mu m \leq L_F \leq Lgd/2$.

Also in the present embodiment, similar to First Embodiment, the cap layer CAP has a tapered side surface. Described specifically, as shown in the drawing, the angle θ between the substrate SUB or the electron supply layer ES and the side surface of the cap layer CAP is less than 90° (θ<90°). By inclining the side surface of the cap layer CAP in such a manner, the electric field in the vicinity of the side surface of the cap layer CAP on the side of the drain electrode DE is relaxed. For example, the peak electric field can be made smaller than that when the cap layer has a vertical side surface (θ=90°). This makes it possible to produce effects of suppressing current collapse, reducing gate leakage, and improving breakdown voltage.

The angle θ between the electron supply layer ES and the side surface of the cap layer CAP is preferably adjusted to fall within the following range: 15°≤θ<90°.

Thus, the present embodiment can also produce effects similar to those of First Embodiment.

Moreover, in the present embodiment, the gate electrode GE is comprised of two portions, that is, the first gate electrode portion GE1 and the second gate electrode portion GE2 and the upper surface of the cap layer CAP is covered with the first gate electrode portion GE1 without placing the insulating film IF between the upper surface of the cap layer CAP and the first gate electrode portion GE1. As a result, similar to Fifth Embodiment, it is possible to avoid a reduction in carrier density of the two-dimensional electron gas (two-dimensional electron gas layer) 2DEG which will otherwise occur by the influence of the insulating film IF between the upper surface of the cap layer CAP and the gate electrode GE.

Thus, the present embodiment is effective for suppressing current collapse, reducing gate leakage, and improving breakdown voltage as in First Embodiment and in addition, can reduce the ON resistance.

[Description of Manufacturing Method]

Figure 20:
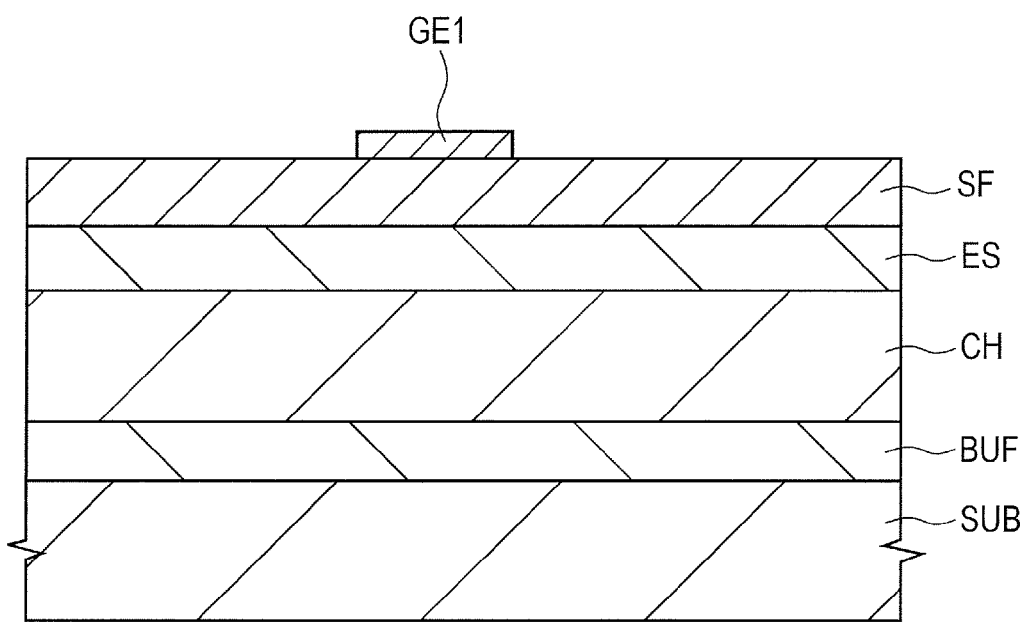
FIG. 20 is a cross-sectional view showing a manufacturing step of the semiconductor device of Sixth Embodiment.
Figure 21:
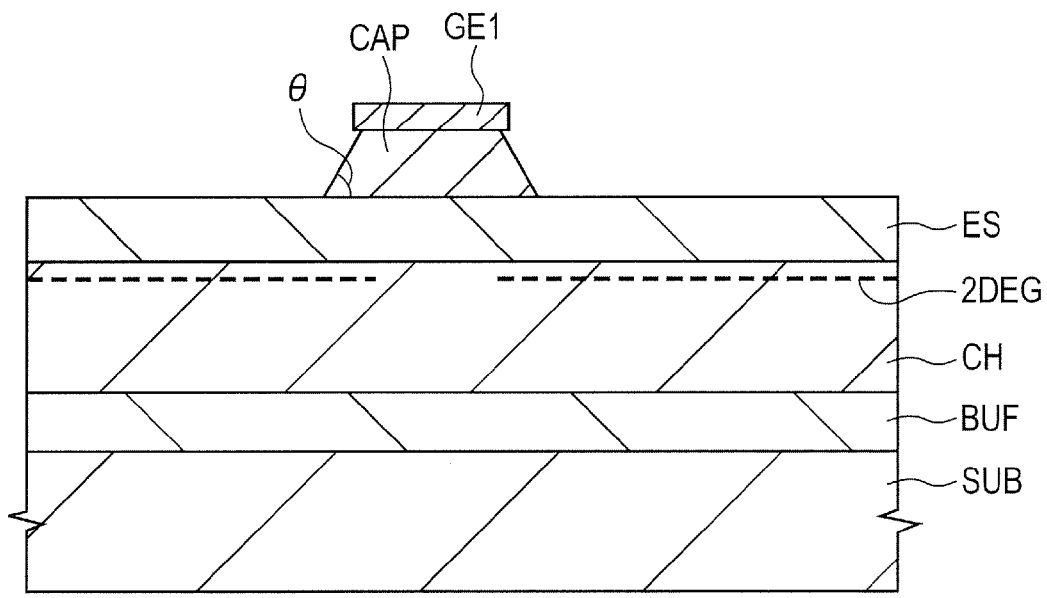
FIG. 21 is a cross-sectional view showing a manufacturing step of the semiconductor device of Sixth Embodiment following the manufacturing step of FIG. 20.

Next, referring to FIGS. 20 and 21, the manufacturing method of the semiconductor device of the present embodiment will be described and at the same time, the constitution of the semiconductor device will be made clearer. FIGS. 20 and 21 are cross-sectional views showing the manufacturing steps of the semiconductor device of the present embodiment, respectively.

As in First Embodiment, a buffer layer BUF is formed on a substrate SUB shown in FIG. 20 and a channel layer CH is formed on the buffer layer. Next, an electron supply layer ES is formed on the channel layer CH, followed by the formation of a semiconductor film SF which will be a cap layer CAP on the electron supply layer.

For example, a semiconductor film SF made of a p type gallium nitride (p type GaN) epitaxial layer is formed on an electron supply layer E made of AlGaN by using MOCVD.

Next, as in Fifth Embodiment, a metal film which will be a first gate electrode portion GE1 is formed on the semiconductor film SF. As the metal film, for example, a film stack of a titanium (Ti) film and an aluminum (Al) film formed on the titanium film is formed using vacuum deposition. As the metal film, a single layer film composed of a metal selected from aluminum, titanium, tungsten, molybdenum, nickel, or the like or a film stack thereof may be used. The first gate electrode portion GE1 may be comprised of a silicide film of a metal such as aluminum, titanium, tungsten, molybdenum, or nickel. Then the above-mentioned metal film is patterned to form the first gate electrode portion GE1.

Next, as shown in FIG. 21, with the first gate electrode portion GE1 as a mask, the semiconductor film SF is patterned to form a cap layer CAP. Etching of the semiconductor film SF is conducted using, for example, inductively coupled plasma dry etching. During this step, the etching conditions are adjusted to taper the side surface of the cap layer CAP. This means that, as shown in the drawing, the angle θ between the substrate SUB or the electron supply layer ES and the side surface of the cap layer CAP is made less than 90° (θ<90°). Etching may be conducted under the following conditions. For example, the first gate electrode portion GE1 serving as a mask is made smaller by etching and the end portions of the first gate electrode portion GE1 are retreated gradually. This makes it possible to increase the etching amount of the underlying cap layer CAP at the end portions of the first gate electrode portion GE1 and taper the side surface of the cap layer CAP. The side surface of the cap layer CAP can also be tapered by etching with a mixture of an isotropic etching species in an anisotropic etching species. Alternatively, the side surface of the cap layer CAP can be tapered by adjusting the conditions such as gas species and pressure.

Moreover, in the present embodiment, overetching is conducted when the semiconductor film SF is etched with the first gate electrode portion GE1 as a mask and the side surface of the cap layer CAP is retreated from the end portion of the first gate electrode portion GE1. In other words, the formation region of the first gate electrode portion GE1 is made larger than the upper surface of the cap layer. Even if the side surface of the cap layer CAP is retreated from the end portion of the first gate electrode portion GE1, the present embodiment produces effects similar to those of Fifth Embodiment so that the present embodiment is superior in controllability of etching.

Next, heat treatment is conducted to eliminate a hydrogen atom from a p type dopant in the cap layer CAP to activate the cap layer CAP. This heat treatment is conducted to produce a two-dimensional electron gas (two-dimensional electron gas layer) 2DEG. The heat treatment is conducted at 750° C. in a nitrogen atmosphere for about 10 minutes.

Next, similar to Fifth Embodiment, a source electrode SE and a drain electrode DE are formed. The source electrode SE and the drain electrode DE can be formed by using the lift-off process as in First Embodiment.

Next, as in Fifth Embodiment, an insulating film IF is formed on the upper surface of the electron supply layer ES including the upper surfaces of the cap layer CAP, the source electrode SE, and the drain electrode DE. As the insulating film IF, for example a silicon nitride (SiN) film having a thickness of about 100 nm is formed using plasma enhanced chemical vapor deposition or the like. Next, the insulating film IF is patterned to form an opening portion OA1 on the cap layer CAP. In this case, different from Fourth Embodiment, the cap layer CAP has thereon the first gate electrode portion GE1 so that an overlapping area of the upper surface of the first gate electrode portion GE1 with the insulating film IF may become large. This means that the insulating film IF may remain at the outer periphery of the upper surface of the first gate electrode portion GE1 (refer to FIG. 19). In forming the opening portion OA1 in the insulating film IF, alignment of the upper surface of the cap layer CAP with the opening portion OA1 requiring high level of control as described in Fourth Embodiment is not necessary. Thus, a high-performance semiconductor device can be manufactured using such simple steps.

Next, as in Fifth Embodiment, a second gate electrode portion GE2 extending over from the first gate electrode portion GE1 to the insulating film IF is formed. This second gate electrode portion GE2 can be formed using, for example, the lift-off process.

By the above-mentioned steps, the semiconductor device of the present embodiment is substantially completed. In the above-mentioned steps, the second gate electrode portion GE2, the source electrode SE, and the drain electrode DE are formed using the lift-off process, but these electrodes may be formed by patterning a metal film instead.

Seventh Embodiment

In Fifth Embodiment and Sixth Embodiment, the first gate electrode portion GE1 and the second gate electrode portion GE2 are brought into direct contact with each other via the opening portion OA1 of the insulating film IF, but the first gate electrode portion GE1 and the second gate electrode portion GE2 may be coupled to each other by using a plug or an external route (external circuit) such as wiring.

The semiconductor device of the present embodiment will next be described in detail referring to a drawing.

[Description of Structure]

Figure 22:
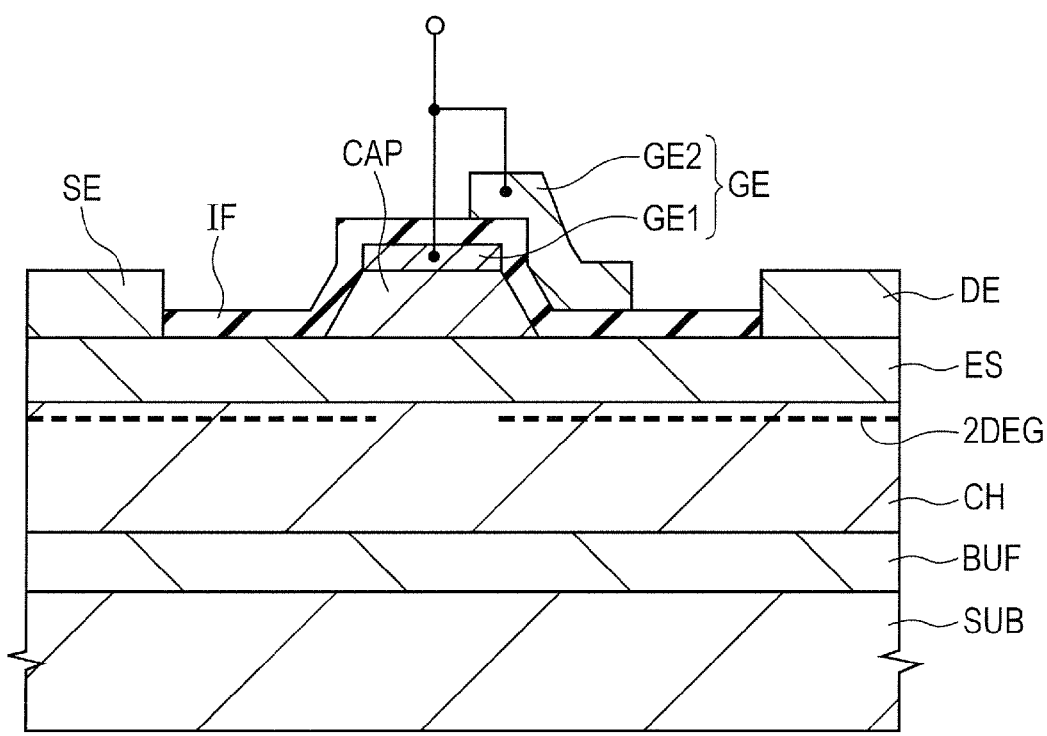
FIG. 22 is a cross-sectional view showing the constitution of a semiconductor device of Seventh Embodiment.

FIG. 22 is a cross-sectional view showing the constitution of the semiconductor device of the present embodiment. The semiconductor device shown in FIG. 22 is a field effect transistor (high electron mobility transistor) using a nitride semiconductor.

As shown in FIG. 22, the semiconductor device of the present embodiment has, similar to that of First Embodiment, a buffer layer BUF on a substrate SUB, a channel layer CH made of a nitride semiconductor on the buffer layer BUF, and an electron supply layer ES made of a nitride semiconductor on the channel layer CH. The electron supply layer ES has a gate electrode GE via a cap layer CAP. This gate electrode GE is comprised of a first gate electrode portion GE1 and a second gate electrode portion GE2. In the vicinity of the interface between the channel layer CH and the electron supply layer ES, a two-dimensional electron gas (two-dimensional electron gas layer) 2DEG is produced (formed). In the region where the cap layer CAP has been formed, the two-dimensional electron gas (two-dimensional electron gas layer) 2DEG is not produced.

In the present embodiment, the first gate electrode portion GE1 is present on the cap layer CAP. The cross-section in FIG. 22 shows that the first gate electrode portion GE1 and the second gate electrode portion GE2 have therebetween an insulating film IF.

Figure 23:
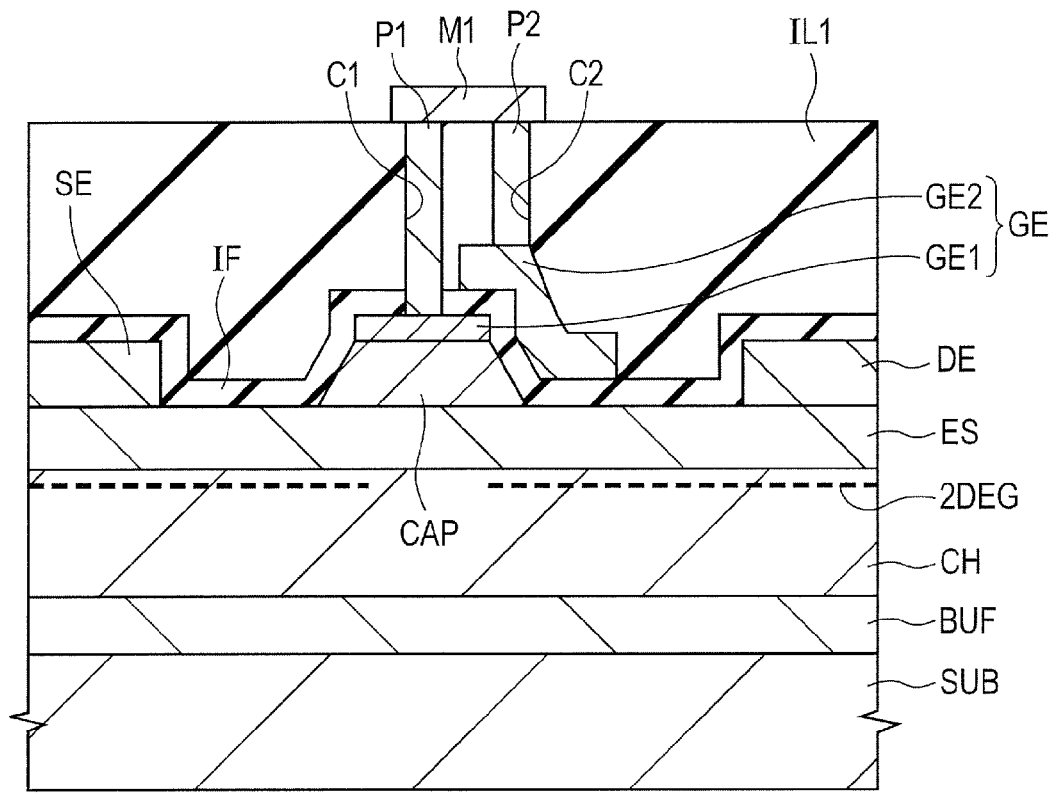
FIG. 23 is a cross-sectional view showing one example of the constitution of the semiconductor device of Seventh Embodiment.

The first gate electrode portion GE1 and the second gate electrode portion GE2 are coupled to each other via a plug (coupling portion) or an external route such as wiring at a cross-section different from that shown in FIG. 22 (refer to FIG. 23).

Thus, even when the first gate electrode portion GE1 and the second gate electrode portion GE2 are coupled to each other via an external route, effects similar to those of Fifth Embodiment can be produced. Thus, the present embodiment is effective for suppressing current collapse, reducing gate leakage, and improving breakdown voltage as in First Embodiment and in addition, can reduce the ON resistance.

[Description of Manufacturing Method]

Next, the manufacturing method of the semiconductor device of the present embodiment will be described and at the same time, the constitution of the semiconductor device will be made clearer. FIG. 23 is a cross-sectional view showing one example of the constitution of the semiconductor device of the present embodiment.

As in First Embodiment, a buffer layer BUF is formed on a substrate SUB shown in FIG. 23 and a channel layer CH is formed on the buffer layer. Next, an electron supply layer ES is formed on the channel layer CH, followed by the formation of a semiconductor film (SF) which will be a cap layer CAP on the electron supply layer.

For example, a semiconductor film (SF) made of a p type gallium nitride (p type GaN) epitaxial layer is formed on an electron supply layer E made of, for example, AlGaN by using MOCVD.

Next, a metal film which will be a first gate electrode portion GE1 is formed on the semiconductor film SF. Then, the metal film is patterned to form the first gate electrode portion GE1.

Next, with the first gate electrode portion GE1 as a mask, the semiconductor film SF is patterned to form a cap layer CAP. The side surface of the cap layer CAP is tapered by patterning while adjusting the etching conditions as described in First Embodiment or the like. Next, heat treatment is conducted to activate the cap layer CAP to produce a two-dimensional electron gas (two-dimensional electron gas layer) 2DEG.

Then, a source electrode SE and a drain electrode DE are formed as in First Embodiment or the like, followed by formation of an insulating film IF. The insulating film IF is formed on the upper surface of the electron supply layer ES including the upper surfaces of the cap layer CAP, the source electrode SE, and the drain electrode DE. As the insulating film IF, for example a silicon nitride (SiN) film having a thickness of about 100 nm is formed using plasma enhanced chemical vapor deposition or the like. Then, a second gate electrode portion GE2 is formed on the insulating film IF2 by the lift-off process.

In the present embodiment, the second gate electrode portion GE2 overhangs on the side of the drain electrode DE. For example, the second gate electrode portion GE2 is formed on the side surface of the cap layer CAP via the insulating film IF, starting from the end portion of the upper surface of the cap layer CAP on the side of the drain electrode DE.

Then, an interlayer insulating film IL1 is formed on the second gate electrode portion GE2. Next, a first contact hole C1 is formed by etching the insulating film IF and the interlayer insulating film IL1 on the first gate electrode portion GE1. In addition, a second contact hole C2 is formed by etching the interlayer insulating film IL1 on the second gate electrode portion GE2. Next, these contact holes (C1, C2) are filled with a metal film to form a first plug P1 and a second plug P2.

Next, a metal film is formed on the upper surface of the interlayer insulating film IL1 including the respective upper surfaces of the first plug P1 and the second plug P2, followed by patterning to form a wiring M1 for coupling the first plug P1 and the second plug P2 to each other. When the first plug P1 and the second plug P2 are formed, a plug may be formed on the source electrode SE or the drain electrode DE. When the wiring M1 for coupling the first plug P1 to the second plug P2 is formed, another wiring to be coupled to the plug on the source electrode SE or the drain electrode DE may be formed.

Thus, even when the first gate electrode portion GE1 and the second gate electrode portion GE2 are coupled using a plug or an external route (external circuit), the present embodiment produces effects similar to those of Fifth Embodiment.

Eighth Embodiment

In Seventh Embodiment, the second gate electrode portion GE2 is coupled to the first gate electrode portion GE1 by using a wiring or the like. The present embodiment is different from it in that the second gate electrode GE2 is coupled to the source electrode SE by using a wiring or the like.

The semiconductor device of the present embodiment will next be described referring to a drawing.

Figure 27:
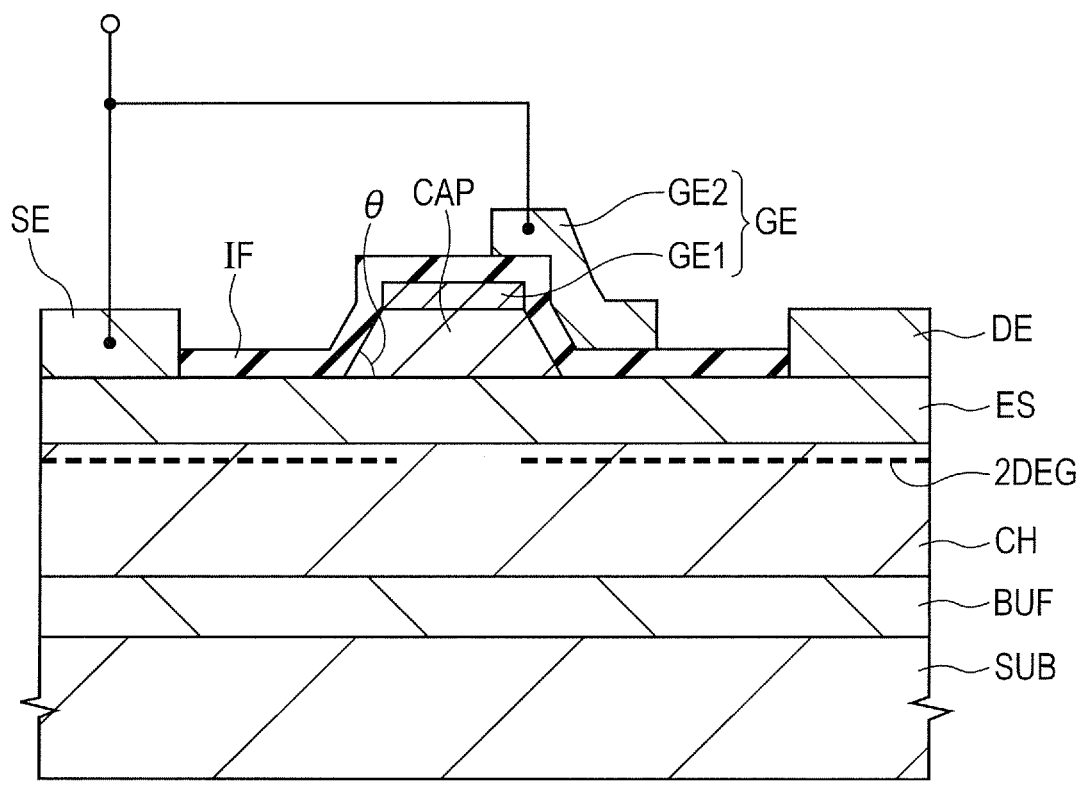
FIG. 27 is a cross-sectional view showing the constitution of a semiconductor device of Eighth Embodiment.

FIG. 27 is a cross-sectional view showing the constitution of the semiconductor device of the present embodiment. A difference from FIG. 22 of Seventh Embodiment is that the second gate electrode portion GE2 is coupled to the source electrode SE via a wiring. Another constitution is similar to that of Seventh Embodiment so that an overlapping description is omitted.

Also in the present embodiment, similar to FIG. 1 of First Embodiment and the like, the angle θ between the side surface of the cap layer CAP and the electron supply layer ES is less than 90°. The present embodiment can therefore suppress current collapse, suppress gate leakage current, and improve breakdown voltage as in First Embodiment.

The angle between the side surface of the cap layer CAP on the side of the source electrode SE and the electron supply layer ES may be the same as or different from the angle between the side surface of the cap layer CAP on the side of the drain electrode DE and the electron supply layer ES.

In particular, however, setting the angle between the side surface of the cap layer CAP on the side of the drain electrode DE and the electron supply layer ES smaller than the angle between the side surface of the cap layer CAP on the side of the source electrode DE and the electron supply layer is effective for improving gate-drain breakdown voltage while reducing source resistance. When the angles are set as described above, it is possible to decrease the concentration of a two-dimensional electron gas from the cap layer CAP to the side of the drain electrode DE and thereby improve the gate-drain breakdown voltage. Moreover, the concentration of a two-dimensional electron gas can be made relatively higher in a region from the cap layer CAP to the side of the source electrode SE than that on the side of the drain, making it possible to reduce the source resistance. As a result, gate-drain breakdown voltage can be improved while reducing source resistance.

The invention made by the present inventors has been described specifically based on some embodiments. The invention is not limited to the above-mentioned embodiments, but needless to say, it can be changed in various ways without departing from the gist of the invention.

For example, the external route of Seventh Embodiment may be employed in the constitution of Sixth Embodiment. For example, in the semiconductor device of First Embodiment or Second Embodiment, the constitution of Third Embodiment in which the overhang amount of the gate electrode GE on the side of the source electrode SE is made smaller may be employed.

In Fifth Embodiment (FIG. 13), the angle θ between the substrate SUB or the electron supply layer ES and the side surface of the cap layer CAP is less than 90°, but this angle θ may be set at 90°.

Figure 24:
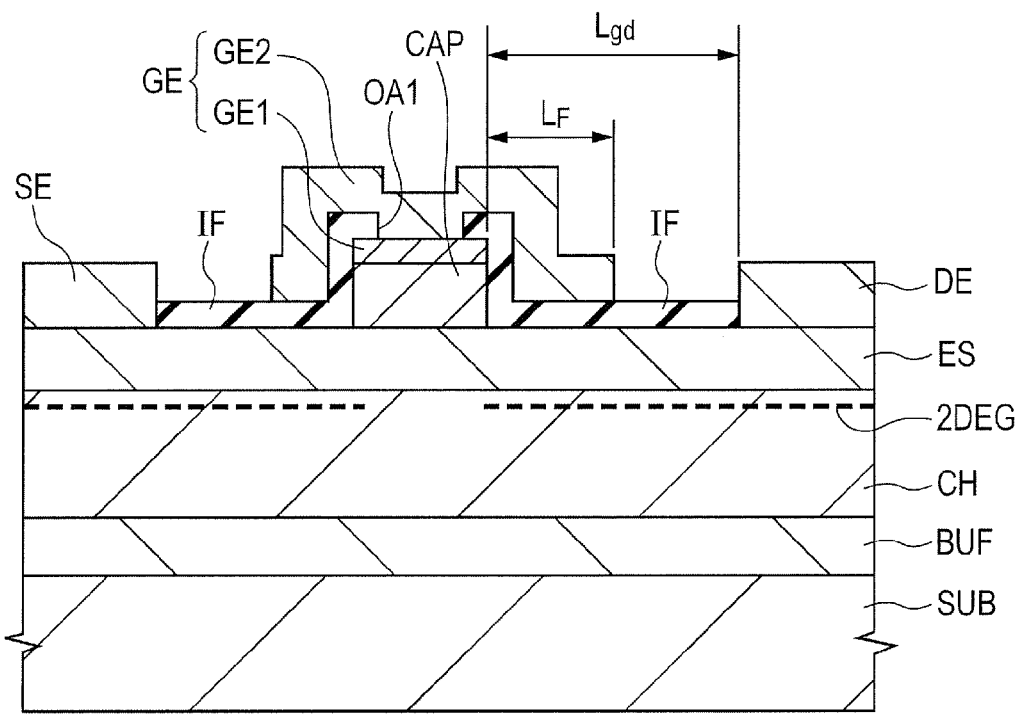
FIG. 24 is a cross-sectional view showing the constitution of the semiconductor device of Fifth Embodiment when the angle $\theta$ is set at 90°.

FIG. 24 is a cross-sectional view showing the constitution of a semiconductor device similar to the semiconductor device of Fifth Embodiment except that the angle θ is set at 90°.

As shown in FIG. 24, when the angle θ between the substrate SUB or the electron supply layer ES and the side surface of the cap layer CAP is 90°, the effect obtained by inclining the side surface of the cap layer CAP decreases.

The above-mentioned constitution having an overhang of the gate electrode on the side of the drain electrode DE is still effective. This means that since the electric field is dispersed into two positions, that is, the vicinity of the side surface of the cap layer CAP on the side of the drain electrode DE and the top of the overhang of the gate electrode GE, the electric field is relaxed.

Figure 25:
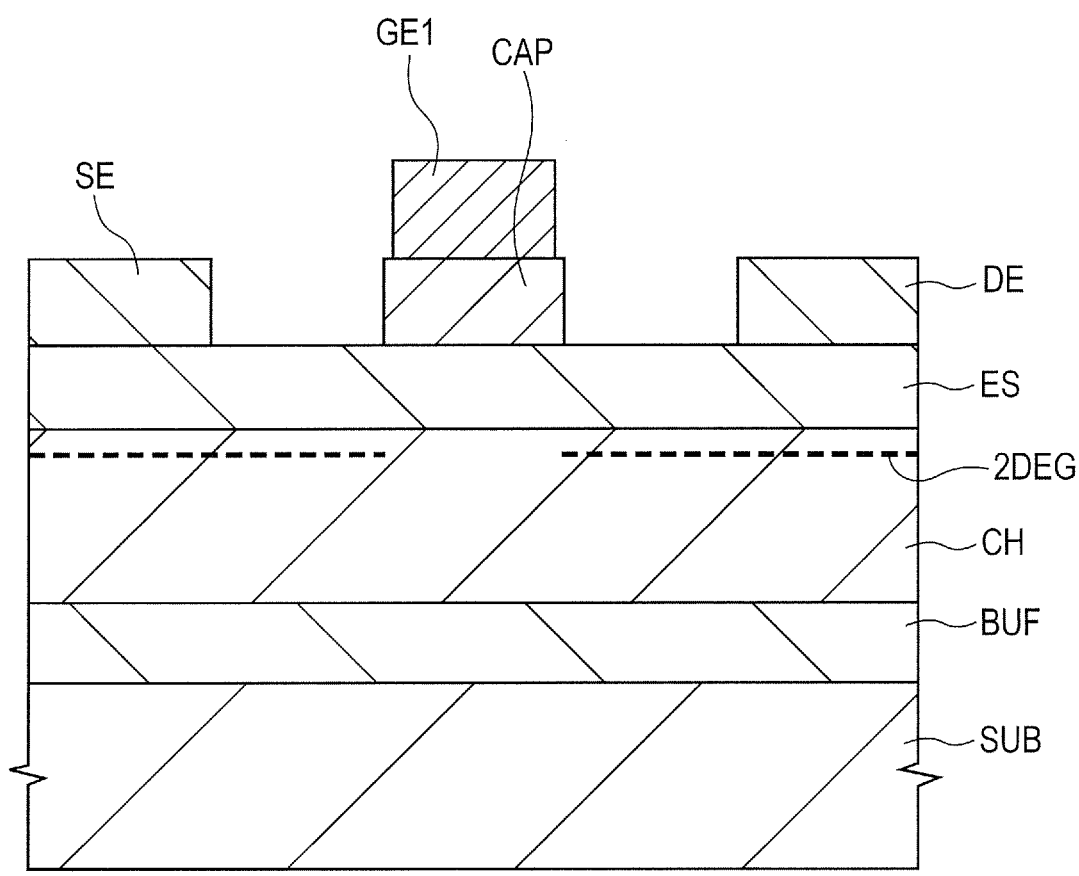
FIG. 25 is a view for describing the effect of the semiconductor device shown in FIG. 24.
Figure 26:
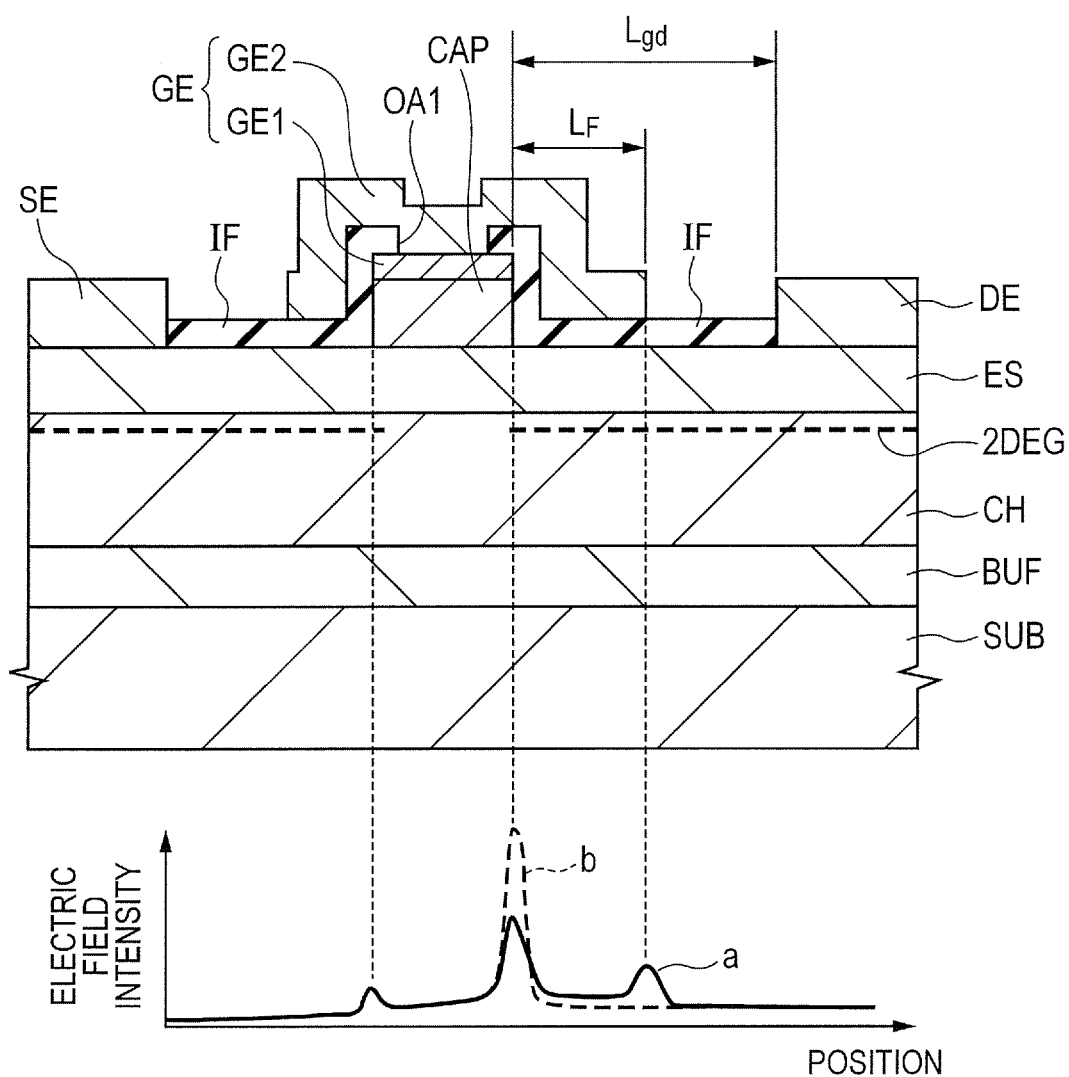
FIG. 26 is a view for describing the effect of the semiconductor device shown in FIG. 24.

More specifically, FIG. 26 shows, on the bottom thereof, the relationship between the field intensity and position in the constitution shown in FIG. 25 and the constitution shown in FIG. 26. The graph b shows the constitution shown in FIG. 25, while the graph a shows the constitution shown in FIG. 26. FIGS. 25 and 26 are drawings for describing the effects of the semiconductor device shown in FIG. 24.

Thus, in the constitutions shown in FIG. 26 (FIG. 24), the peak value of the graph b is dispersed into two positions, as shown in the graph a, that is, the vicinity of the side surface on the side of the drain electrode DE and the top of the overhang of the gate electrode GE, by which the electric field is relaxed.

In the constitution shown in FIG. 24, the gate electrode GE is comprised of two portions so that compared with the constitution shown in FIG. 25, a reduction in the carrier density of a two-dimensional electron gas (two-dimensional electron gas layer) 2DEG which will otherwise occur by the misalignment between the cap layer CAP and the gate electrode GE can be avoided.

Thus, it is possible to change the constitution of each of the embodiments such as partial omission or substitution without departing from the gist of the present invention. In addition, in a compositional formula (for example, AlGaN) of a specific material shown in the above embodiments, the compositional ratio of elements may be determined as needed without departing from the gist of the present invention.

What is claimed is:

1. A semiconductor device having a field effect transistor, comprising:
    a channel layer having a first nitride semiconductor layer,
    an electron supply layer formed over the channel layer and having a second nitride semiconductor layer having a band gap different from that of the first nitride semiconductor layer,
    a source electrode formed over the electron supply layer,
    a drain electrode formed over the electron supply layer while being separated from the source electrode,
    a cap layer having a p type semiconductor layer, formed over the electron supply layer between the source electrode and the drain electrode, and having a tapered side surface such that a thickness of the cap layer, in a horizontal direction from the source electrode to the drain electrode, continuously decreases as the cap layer extends away from the electron supply layer, the thickness of the cap layer continuously decreasing from the bottom of the cap layer to the top of the cap layer,
    an insulating film having an opening portion on and exposing an upper surface of the cap layer and covering the tapered side surface of the cap layer, and
    a gate electrode formed in the opening portion that exposes the upper surface of the cap layer and extending over the tapered side surface of the cap layer on a side of the drain electrode via the insulating film,
    wherein the cap layer has a first layer, a second layer formed over the first layer, and a third layer formed over the second layer, and
    wherein a p type impurity concentration of the first layer and the third layer is lower than a p type impurity concentration of the second layer.

2. The semiconductor device according to claim 1,
    wherein a distance of the gate electrode from a center portion of the opening portion to an end portion of the gate electrode on the side of the drain electrode is greater than a distance of the gate electrode from the center portion of the opening portion to an end portion of the gate electrode on a side of the source electrode.

3. The semiconductor device according to claim 1,
    wherein a distance LF from an end portion of the cap layer on a side of the drain electrode to an end portion of the gate electrode on a side of the drain electrode and a distance Lgd from the end portion of the cap layer on the side of the drain electrode to the drain electrode satisfy the following range: 0.05 µm≤$L_F$≤Lgd/2.

4. The semiconductor device according to claim 1, wherein an angle θ between an upper surface of the electron supply layer and the tapered side surface of the cap layer falls within the following range: 15°≤θ<90°.

5. The semiconductor device according to claim 1, wherein the channel layer has GaN or InGaN and the electron supply layer has AlGaN, InAlN, or InAlGaN.

6. The semiconductor device according to claim 1, wherein the cap layer has a p type GaN or AlGaN.

7. The semiconductor device according to claim 1, wherein a contact between the cap layer and the gate electrode is Schottky contact.

8. The semiconductor device according to claim 1, further comprising:
a buffer layer formed below the channel layer and a semiconductor substrate formed below the buffer layer.

9. The semiconductor device according to claim 1, wherein in the cap layer, a p type impurity concentration in a lower layer portion is lower than a p type impurity concentration in an upper layer portion.

10. The semiconductor device according to claim 1, wherein in the cap layer, a p type impurity concentration in a lower layer portion and an upper layer portion is lower than a p type impurity concentration in a middle layer portion located between the lower layer portion and the upper layer portion.

11. The semiconductor device according to claim 1, wherein the insulating film has the opening portion from which an entire upper surface of the cap layer is exposed and covers the tapered side surface of the cap layer.

12. A semiconductor device having a field effect transistor, comprising:
a channel layer having a first nitride semiconductor layer,
an electron supply layer formed over the channel layer and having a second nitride semiconductor layer having a band gap different from that of the first nitride semiconductor layer,
a source electrode formed over the electron supply layer,
a drain electrode formed over the electron supply layer while being separated from the source electrode,
a cap layer having a p type semiconductor layer, formed over the electron supply layer between the source electrode and the drain electrode, and having an inclined side surface,
a first gate electrode portion formed over an upper surface of the cap layer,
an insulating film having an opening portion over an upper surface of the first gate electrode portion and covering the inclined side surface of the cap layer, and
a second gate electrode portion formed in the opening portion and extending, via the insulating film, over the inclined side surface of the cap layer on a side of the drain electrode.

13. The semiconductor device according to claim 12, wherein a formation region of the first gate electrode portion is wider than the upper surface of the cap layer.

14. The semiconductor device according to claim 12, wherein a distance of the second gate electrode portion from a center portion of the opening portion to an end portion of the second gate electrode portion on a side of the drain electrode is greater than a distance from the center portion of the opening portion to an end portion of the second gate electrode portion on a side of the source electrode.

15. The semiconductor device according to claim 12, wherein an angle θ between the electron supply layer and the inclined side surface of the cap layer falls within a range of 15°≤θ<90°.

16. A semiconductor device having a field effect transistor, comprising:
a channel layer having a first nitride semiconductor layer,
an electron supply layer formed over the channel layer and having a second nitride semiconductor layer having a band gap different from that of the first nitride semiconductor layer,
a source electrode formed over the electron supply layer,
a drain electrode formed over the electron supply layer while being separated from the source electrode,
a cap layer having a p type semiconductor layer and formed over the electron supply layer between the source electrode and the drain electrode,
a first gate electrode formed over an upper surface of the cap layer, and
a second gate electrode extending via an insulating film while covering from an upper portion of the cap layer on a side of the drain electrode to a side surface of the cap layer, and electrically coupled through a separate and distinct coupling portion to the first gate electrode without directly contacting the first gate electrode,
wherein the coupling portion comprises:
a first plug formed in a first contact hole of an interlayer insulating film formed about the first and the second gate electrodes;
a second plug formed in a second contact hole of the interlayer insulating film formed about the first and the second gate electrodes; and
a metal wiring formed above the interlayer insulating film, the metal layer connecting the first and the second plugs,
wherein the cap layer has a first layer, a second layer formed over the first layer, and a third layer formed over the second layer, and
wherein a p type impurity concentration of the first layer and the third layer is lower than a p type impurity concentration of the second layer.

17. The semiconductor device according to claim 16, wherein an angle θ between the electron supply layer and the side surface of the cap layer is less than 90°.

18. The semiconductor device according to claim 16, wherein the first gate electrode and the second gate electrode are coupled to each other via a separate and distinct plug formed in a contact hole provided over the first gate electrode portion.

* * * * *